US012278213B2

(12) United States Patent
Wang et al.

(10) Patent No.: US 12,278,213 B2
(45) Date of Patent: Apr. 15, 2025

(54) DISPLAY SUBSTRATE AND DISPLAY DEVICE

(71) Applicant: BOE TECHNOLOGY GROUP CO., LTD., Beijing (CN)

(72) Inventors: Mingxing Wang, Beijing (CN); Meng Yan, Beijing (CN); Qingxun Zhang, Beijing (CN); Qian Wu, Beijing (CN); Xuan Feng, Beijing (CN); Xiawei Yun, Beijing (CN); Guangcai Yuan, Beijing (CN); Xue Dong, Beijing (CN); Muxin Di, Beijing (CN); Zhiwei Liang, Beijing (CN); Ke Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 813 days.

(21) Appl. No.: 17/422,220

(22) PCT Filed: Oct. 21, 2020

(86) PCT No.: PCT/CN2020/122431
§ 371 (c)(1),
(2) Date: Jul. 12, 2021

(87) PCT Pub. No.: WO2022/082491
PCT Pub. Date: Apr. 28, 2022

(65) Prior Publication Data
US 2022/0216183 A1    Jul. 7, 2022

(51) Int. Cl.
*H01L 27/15* (2006.01)
*H01L 23/00* (2006.01)
(Continued)

(52) U.S. Cl.
CPC .... *H01L 25/0655* (2013.01); *H01L 23/49838* (2013.01); *H01L 24/06* (2013.01);
(Continued)

(58) Field of Classification Search
CPC .... H10K 59/35; H10K 59/353; H01L 27/156; H01L 25/167
See application file for complete search history.

(56) References Cited

U.S. PATENT DOCUMENTS 10,692,940 B2 * 6/2020 Liu ..................... H10K 59/352
11,088,209 B2    8/2021 Shih et al.
(Continued)

FOREIGN PATENT DOCUMENTS

| CN | 105097873 A | 11/2015 |
|---|---|---|
| CN | 110310578 A | 10/2019 |
| CN | 110634908 A | 12/2019 |

*Primary Examiner* — Phat X Cao
(74) *Attorney, Agent, or Firm* — Chiwin Law LLC

(57) ABSTRACT

A display substrate and a display device are provided. The display substrate includes a backplane including a plurality of pixel regions; and light emitting units arranged in one-to-one correspondence with the plurality of pixel regions. Each light emitting unit includes light emitting sub-units arranged in a plurality of rows and a plurality of columns, each row of light emitting sub-units includes a plurality of light emitting sub-units arranged along a row direction, each column of light emitting sub-units includes one light emitting sub-unit, and orthographic projections of light emitting regions of two adjacent columns of light emitting sub-units on a first straight line extending along a column direction are not overlapped; and in each light emitting unit, there is no gap between orthographic projections of the light emitting regions of the two adjacent columns of light emitting sub-units on a second straight line extending along the row direction.

20 Claims, 8 Drawing Sheets

(51) Int. Cl.
*H01L 23/498* (2006.01)
*H01L 25/065* (2023.01)
*H10K 59/35* (2023.01)

(52) U.S. Cl.
CPC ............ *H01L 24/14* (2013.01); *H01L 24/16* (2013.01); *H01L 24/17* (2013.01); *H01L 27/156* (2013.01); *H10K 59/35* (2023.02); *H01L 24/13* (2013.01); *H01L 2224/0603* (2013.01); *H01L 2224/06163* (2013.01); *H01L 2224/13013* (2013.01); *H01L 2224/1403* (2013.01); *H01L 2224/14131* (2013.01); *H01L 2224/14134* (2013.01); *H01L 2224/16106* (2013.01); *H01L 2224/16238* (2013.01); *H01L 2224/17106* (2013.01)

(56) References Cited

U.S. PATENT DOCUMENTS

| | | | |
|---|---|---|---|
| 11,699,687 B2 * | 7/2023 | Ahmed | G02B 3/0037 315/51 |
| 2012/0012853 A1 | 1/2012 | Kasahara | |
| 2017/0117334 A1 | 4/2017 | Guo et al. | |
| 2019/0043932 A1 * | 2/2019 | Shih | H10K 59/353 |
| 2019/0131341 A1 | 5/2019 | Hsieh et al. | |

\* cited by examiner

DISPLAY SUBSTRATE AND DISPLAY DEVICE

This application is a U.S. National Phase Entry of International Application No. PCT/CN2020/122431 filed on Oct. 21, 2020, designating the United States of America. The present application claims priority to and the benefit of the above-identified applications and the above-identified applications are incorporated by reference herein in their entirety.

TECHNICAL FIELD

At least one embodiment of the present disclosure relates to a display substrate and a display device.

BACKGROUND

With the development of display technology, people's requirements for the resolution of the display device have gradually improved. Compared with a liquid crystal display device (LCD) and an organic light emitting diode (OLED) display device, an inorganic light emitting display device, such as Mini LED or Micro LED, has the advantages of ultra-high resolution display. The application of Mini LED or Micro LED to 3D display technology can also improve the 3D display effect.

SUMMARY

At least an embodiment of the present disclosure provides a display substrate and a display device.

At least an embodiment of the present disclosure provides a display substrate, which includes a backplane including a plurality of pixel regions; and a plurality of light emitting units arranged in one-to-one correspondence with the plurality of pixel regions. Each of the plurality of light emitting units includes light emitting sub-units arranged in a plurality of rows and a plurality of columns, each row of light emitting sub-units includes a plurality of light emitting sub-units arranged along a row direction, each column of light emitting sub-units includes one light emitting sub-unit, and orthographic projections of light emitting regions of two adjacent columns of light emitting sub-units on a first straight line extending along a column direction are not overlapped; and in each of the plurality of light emitting units, there is no gap between orthographic projections of the light emitting regions of the two adjacent columns of light emitting sub-units on a second straight line extending along the row direction.

For example, in an embodiment of the present disclosure, the orthographic projections of the light emitting regions of the two adjacent columns of light emitting sub-units on the second straight line are overlapped, or, endpoints, which are close to each other, of the orthographic projections of the light emitting regions of the two adjacent columns of light emitting sub-units on the second straight line coincide.

For example, in an embodiment of the present disclosure, a distance between light emitting regions of any two light emitting sub-units located in a same row and adjacent to each other is equal.

For example, in an embodiment of the present disclosure, the light emitting sub-units arranged in the plurality of rows and the plurality of columns include N rows of light emitting sub-units, and an orthographic projection of light emitting regions of an n-th row of light emitting sub-units on the second straight line is located between an orthographic projection of light emitting regions of an (n−1)-th row of light emitting sub-units on the second straight line and an orthographic projection of light emitting regions of an (n+1)-th row of light emitting sub-units on the second straight line, or the orthographic projection of the light emitting regions of the n-th row of light emitting sub-units on the second straight line is located between the orthographic projection of the light emitting regions of the (n−1)-th row of light emitting sub-units on the second straight line and an orthographic projection of light emitting regions of a first row of light emitting sub-units on the second straight line, where N>1 and 1<n≤N.

For example, in an embodiment of the present disclosure, each of the plurality of pixel regions includes first contact pads arranged in a plurality of rows and a plurality of columns and at least one second contact pad, and the at least one second contact pad is located at one side of the first contact pad distributed at an edge of the each of the plurality of pixel regions away from the first contact pad distributed at a center of the each of the plurality of pixel regions; each of the plurality of light emitting units includes a plurality of first electrodes and at least one second electrode located at a same side, and each of the light emitting sub-units includes one first electrode, at least parts of the plurality of first electrodes are configured to be respectively connected with the first contact pads arranged in the plurality of rows and the plurality of columns, and the second electrode is configured to be connected with the second contact pad.

For example, in an embodiment of the present disclosure, each of the plurality of light emitting units further includes a plurality of first conductive type semiconductor layers, a second conductive type semiconductor layer and a light emitting layer located between the plurality of first conductive type semiconductor layers and the second conductive type semiconductor layer, the plurality of first conductive type semiconductor layers are respectively connected with the plurality of first electrodes in one-to-one correspondence, and the second conductive type semiconductor layer is connected with the second electrode.

For example, in an embodiment of the present disclosure, in each of the plurality of light emitting units, the second electrode is a common electrode shared by the plurality of light emitting sub-units, and the second conductive type semiconductor layer is a continuous film.

For example, in an embodiment of the present disclosure, in each of the plurality of light emitting units, each of the plurality of light emitting sub-units includes a plurality of nano-pillar structures arranged at intervals, each of the plurality of nano-pillar structures at least includes the light emitting layer, the first conductive type semiconductor layer and the first electrode which are stacked, and the light emitting region of each of the plurality of light emitting sub-units is at least partially overlapped with each of the plurality of first contact pads.

For example, in an embodiment of the present disclosure, each row of first contact pads includes a plurality of first contact pads arranged along the row direction, each column of first contact pads includes one first contact pad, and orthographic projections of two adjacent columns of first contact pads on the first straight line are not overlapped; and in each of the plurality of pixel regions, there is no gap between orthographic projections of the two adjacent columns of first contact pads on the second straight line.

For example, in an embodiment of the present disclosure, the orthographic projections of the two adjacent columns of first contact pads on the second straight line are overlapped, or, endpoints, which are close to each other, of the orthographic projections of the two adjacent columns of first contact pads on the second straight line coincide.

For example, in an embodiment of the present disclosure, a distance between any two first contact pads located in a same row and adjacent to each other is equal.

For example, in an embodiment of the present disclosure, a pitch of the plurality of nano-pillar structures along the row direction is less than a distance between adjacent first contact pads arranged along the row direction.

For example, in an embodiment of the present disclosure, the magnitude of the pitch along the row direction is in a range from 200 nanometers to 100 micrometers, the distance between adjacent first contact pads arranged along the row direction is in a range from 5 micrometers to 1000 micrometers, and the size of each of the plurality of nano-pillar structures along the row direction is in a range from 100 nanometers to 50 micrometers.

For example, in an embodiment of the present disclosure, in each of the plurality of light emitting units, the light emitting layer is a continuous film.

For example, in an embodiment of the present disclosure, the backplane is located at a light exiting side of the plurality of light emitting units, and a light shielding layer is disposed at least one of between adjacent light emitting units, at a side of the plurality of light emitting units away from the backplane and between adjacent first electrodes.

For example, in an embodiment of the present disclosure, the display substrate further includes: a light splitting device, located at a light exiting side of the plurality of light emitting units, and configured to split light emitted from the plurality of light emitting sub-units into different viewpoint regions.

For example, in an embodiment of the present disclosure, the light splitting device includes a plurality of lenses arranged along the row direction, and an orthographic projection of each of the plurality of lens on the base substrate is overlapped with an orthographic projection of one column of light emitting units on the base substrate.

For example, in an embodiment of the present disclosure, each of the plurality of light emitting units is a micro light emitting diode or a mini light emitting diode.

At least an embodiment provides a display device, including the display substrate as mentioned above.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects.

The embodiments of the present disclosure provide a display substrate and a display device. The display substrate includes: a backplane, including a plurality of pixel regions; a plurality of light emitting units arranged in one-to-one correspondence with the plurality of pixel regions. Each light emitting unit includes light emitting sub-units arranged in a plurality of rows and a plurality of columns, each row of light emitting sub-units includes a plurality of light emitting sub-units arranged along a row direction, each column of light emitting sub-units includes one light emitting sub-unit, and orthographic projections of light emitting regions of two adjacent columns of light emitting sub-units on a first straight line extending along a column direction are not overlapped; and in each light emitting unit, there is no gap between orthographic projections of the light emitting regions of the two adjacent columns of light emitting sub-units on a second straight line extending along the row direction. In the embodiments of the present disclosure, by setting the positional relationship of the light emitting regions of two adjacent columns of light emitting sub-units on the display substrate, there may be no black region between the light emitting regions of two adjacent columns of light emitting sub-units, so as to improve the display effect.

Hereinafter, the display substrate and the display device provided by the embodiments of the present disclosure will be described with reference to the accompanying drawings.

Figure 1:
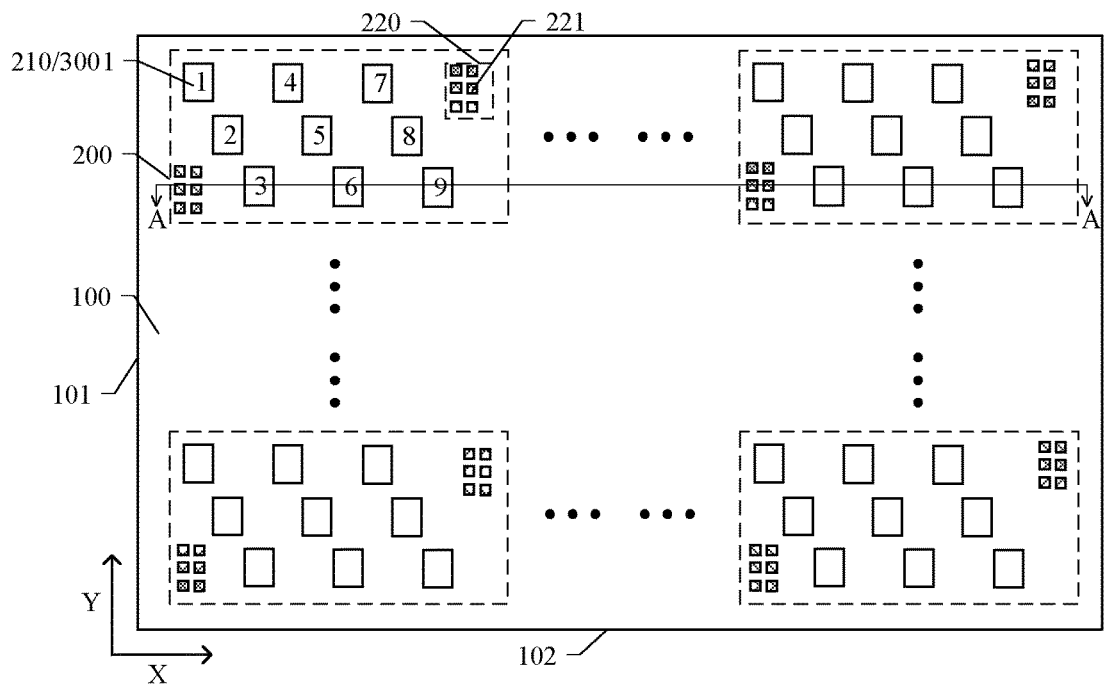
FIG. 1 is a partial structural view of a backplane of a display substrate according to an embodiment of the present disclosure.

FIG. 1 is a partial structural view of a backplane of a display substrate according to an embodiment of the present disclosure. As shown in FIG. 1, the backplane includes a base substrate 100 and a plurality of pixel regions 200 located on the base substrate 100, and each pixel region 200 includes first contact pads 210 arranged in a plurality of rows and a plurality of columns. For example, as shown in FIG. 1, in the embodiment of the present disclosure, the row direction is the X direction and the column direction is the Y direction. The embodiment of the present disclosure illustratively shows that the row direction and the column direction are substantially perpendicular to each other, but is not limited thereto, and the row direction and the column direction may not be perpendicular to each other. For example, the plurality of pixel regions 200 can be arrayed along the row direction and the column direction, but are not limited thereto. For example, FIG. 1 illustratively shows that each pixel region 200 can include three rows of first contact pads 210, but is not limited thereto. Each pixel region can include two rows of first contact pads, or each pixel region can include four or more rows of first contact pads, the embodiment of the present disclosure is not limited thereto. The number of rows and columns of the first contact pads can be determined according to the requirement and size of the actual product.

As shown in FIG. 1, in each pixel region 200, each row of first contact pads 210 includes a plurality of first contact pads 210 arranged along the row direction, and each column of first contact pads 210 includes one first contact pad 210. For example, in each pixel region 200, the number of the first contact pads 210 arranged in the row direction is multiple, and the number of the first contact pads 210 arranged in the column direction is one, that is, each first contact pad 210 is a single column of first contact pads 210.

As shown in FIG. 1, the orthographic projections of two adjacent columns of first contact pads 210 on a first straight line extending along the column direction are not overlapped; in each pixel region 200, there is no gap between the orthographic projections of two adjacent columns of first contact pads 210 on a second straight line extending along the row direction. For example, as shown in FIG. 1, the base substrate 100 includes a first side 101 extending along the column direction and a second side 102 extending along the row direction. For example, the first straight line described above is the straight line in which the first side 101 of the base substrate 100 is located, and the second straight line described above is the straight line in which the second side 102 of the base substrate 100 is located. For example, as shown in FIG. 1, in each pixel region 200, the orthographic projections of two adjacent columns of first contact pads 210 on the first side 101 are not overlapped, and there is no gap between the orthographic projections of two adjacent columns of first contact pads 210 on the second side 102. The "two adjacent columns of first contact pads" described above refers to two first contact pads located in two adjacent columns, the two first contact pads are located in different rows, and there is not any other first contact pad between the two columns of first contact pads.

For example, as shown in FIG. 1, the orthographic projections of two adjacent columns of first contact pads 210 on the second straight line are overlapped, so that there is no gap between the orthographic projections of the two adjacent columns of first contact pads on the second straight line. For example, the orthographic projections of two adjacent columns of first contact pads 210 on the second side 102 of the base substrate 100 are overlapped. For example, the size of the overlapping part of the orthographic projections of two adjacent columns of first contact pads 210 on the second straight line is relatively small, and the size is not greater than $1/20$ of the size of each first contact pad 210 in the row direction.

For example, as shown in FIG. 1, the endpoints, which are close to each other, of the orthographic projections of two adjacent columns of first contact pads 210 on the second straight line coincide. For example, the endpoints, which are close to each other, of the orthographic projections of two adjacent columns of first contact pads 210 on the second side of the base substrate 100 coincide. For example, as shown in FIG. 1, taking that the shape of each first contact pad 210 is rectangular as an example, the edge of the first column of first contact pads 210 close to the second column of first contact pads 210 and extending in the Y direction is in a straight line with the edge of the second column of first contact pads 210 close to the first column of first contact pads 210 and extending in the Y direction, the edge of the second column of first contact pads close to the third column of first contact pads 210 and extending in the Y direction is in a straight line with the edge of the third column of first contact pads 210 close to the second column of first contact pads 210 and extending in the Y direction, and so on.

For example, as shown in FIG. 1, the distance between any two first contact pads 210 located in the same row and adjacent to each other is equal. For example, two first contact pads 210 located in the same row and adjacent to each other are respectively located in non-two adjacent columns. For example, as shown in FIG. 1, the distance between two first contact pads 210 located in the first row and adjacent to each other is equal to the distance between two first contact pads 210 located in the second row and adjacent to each other, the distance between two first contact pads 210 located in the second row and adjacent to each other is equal to the distance between two first contact pads 210 located in the third row and adjacent to each other, and so on.

For example, as shown in FIG. 1, the first contact pads 210 arranged in the plurality of rows and the plurality of columns include N rows of first contact pads 210, and the orthographic projection of the n-th row of first contact pads 210 on the second straight line is located between the orthographic projection of the (n−1)-th row of first contact pads 210 on the second straight line and the orthographic projection of the (n+1)-th row of first contact pads 210 on the second straight line, or the orthographic projection of the n-th row of first contact pads 210 on the second straight line is located between the orthographic projection of the (n−1)-th row of first contact pads 210 on the second straight line and the orthographic projection of the first row of first contact pads 210 on the second straight line, where N>1 and 1<n≤N.

For example, as shown in FIG. 1, taking N=3 as an example, the orthographic projection of the second row of first contact pads 210 on the second straight line is located between the orthographic projection of the first row of first contact pads 210 on the second straight line and the orthographic projection of the third row of first contact pads 210 on the second straight line, the orthographic projection of the third row of first contact pads 210 on the second straight line is located between the orthographic projection of the second row of first contact pads 210 on the second straight line and the orthographic projection of the first row of first contact pads 210 on the second straight line.

For example, taking adjacent N columns of first contact pads 210 as one contact pad group, each contact pad group includes the first to N-th rows of first contact pads 210, and the first contact pads 210 having a count of N in each contact pad group are arranged in a stepped shape. For example, the orthographic projections of the first contact pads 210 having a count of N in each contact pad group on the second straight line are sequentially arranged in the order from the first row to the n-th row.

For example, as shown in FIG. 1, each pixel region 200 further includes at least one second contact pad 220, and the second contact pad 220 is located at one side of the first contact pad 210 distributed at the edge of each pixel region away from the first contact pad 210 distributed at the center of each pixel region. For example, the second contact pad 220 can be located at one side of the last row of first contact pads 210 away from the first row of first contact pads 210, but is not limited thereto, and the second contact pad 220 can be located at one side of the first row of first contact pads away from the last row of first contact pads 210. For example, the second contact pad 220 is not distributed between adjacent first contact pads 210 in the same row, and the second contact pad 220 is not distributed between adjacent rows of first contact pads 210.

For example, as shown in FIG. 1, each pixel region 200 can also include two second contact pads 220, and the two second contact pads 220 can be located at two diagonal positions close to the each pixel region 200.

Figure 2:
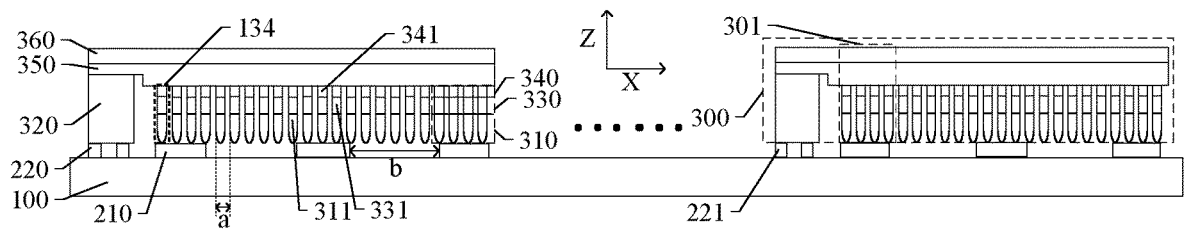
FIG. 2 is a partial cross-sectional structural view of a display substrate according to an embodiment of the present disclosure.

FIG. 2 is a partial cross-sectional structural view of a display substrate according to an embodiment of the present disclosure, and FIG. 2 shows a partial cross-sectional structural view taken along line AA shown in FIG. 1. As shown in FIG. 2, the display substrate includes the backplane shown in FIG. 1 and a plurality of light emitting units 300 arranged in one-to-one correspondence with the plurality of pixel regions 200, each light emitting unit 300 includes a plurality of first electrodes 310 and a second electrode 320 located at the same side, at least parts of the first electrodes 310 are configured to be respectively connected with the first contact pads 210 arranged in the plurality of rows and the plurality of columns, and the second electrode 320 is configured to be connected with the second contact pad 220. The plurality of first electrodes described above are arranged at intervals. For example, as shown in FIG. 2, the first electrodes 310 and the second electrode 320 of each light emitting unit 300 are located at one side of the light emitting unit 300 facing the backplane, so as to be electrically connected with the first contact pads 210 and the second contact pad 220 on the backplane, respectively.

For example, the number of the first electrodes 310 included in each light emitting unit 300 can be greater than the number of the first contact pads 210 included in the corresponding pixel region 200. For example, the first electrodes 310 included in each light emitting unit 300 can be arranged in an array, and a light emitting sub-unit 301 is formed at the position where the first electrode 310 contact with the first contact pad 210, so the position arrangement of the light emitting sub-units 301 is determined by the position arrangement of the first contact pads 210, and the position and the size of the light emitting region of the light emitting sub-unit 301 are also respectively determined by the position and the size of the first contact pad 210.

For example, a tapered or tubular protruding structure can be formed at one side of the first electrode 310 facing the first contact pad 210, or a hard metal structure with protrusions can be additionally provided at one side of the first electrode 310 facing the first contact pad 210, or a conductive particle can be provided at one side of the first electrode 310 facing the first contact pad 210, and so on, so that a non-conductive adhesive can be coated on the first electrode 310 or the first contact pad 210 when the first electrode 310 is bonded to the first contact pad 210, thus ensuring the alignment and physical connection therebetween; then, the protruding structure or conductive particle at one side of the first electrode 310 facing the first contact pad 210 are pressed onto the first contact pad 210 by external force such as pressure, thereby realizing the electrical connection between the first electrode 310 and the first contact pad 210. Accordingly, a tapered or tubular protruding structure can be formed at one side of the first contact pad 210 facing the first electrode 310, or a hard metal structure with protrusions can be additionally provided at one side of the first contact pad 210 facing the first electrode 310, or a conductive particle can be provided at one side of the first contact pad 210 facing the first electrode 310, and so on, so that a non-conductive adhesive can be coated on the first electrode 310 or the first contact pad 210 when the first electrode 310 is bonded to the first contact pad 210, thus ensuring the alignment and physical connection therebetween; then, the protruding structure or conductive particle at one side of the first electrode 310 facing the first contact pad 210 are pressed onto the first contact pad 210 by external force such as pressure, thereby realizing the electrical connection between the first electrode 310 and the first contact pad 210.

The embodiments of the present disclosure are not limited thereto. When the first electrode is bonded to the first contact pad, an anisotropic conductive adhesive can also be coated on the first electrode or the first contact pad, and then a conductive path in the vertical direction can be realized under the pressure, so as to realize electrical connection and adhesive bonding between the first electrode and the first contact pad. For example, the first electrode 310 in part of light emitting units 300 can include indium tin oxide (ITO) and a metal material located at one side of ITO facing the first contact pad 210, such as titanium, aluminum, nickel, gold, copper, indium, zinc, silver or zinc alloy, etc., and the metal material is electrically connected with the first contact pad. For example, after the light emitting unit is transferred onto the backplane by means of laser, machinery, etc., the light emitting units can be fixed on the backplane under certain pressure and temperature, or by means of ultraviolet irradiation.

For example, the plurality of light emitting units can include a blue light emitting unit, a green light emitting unit and a red light emitting unit, the blue light emitting unit is configured to emit blue light, the green light emitting unit is configured to emit green light, and the red light emitting unit is configured to emit red light. The distribution manner of light emitting sub-units in each color light emitting unit is the same, that is, the distribution manner of first contact pads in the pixel region corresponding to each color light emitting unit is the same.

As shown in FIG. 2, each light emitting unit 300 further includes a plurality of first conductive type semiconductor layers 330, a second conductive type semiconductor layer 350 and light emitting layers 340 located between the plurality of first conductive type semiconductor layers 330 and the second conductive type semiconductor layer 350, the plurality of first conductive type semiconductor layers 330 are respectively connected with the plurality of first electrodes 310 in one-to-one correspondence, and the second conductive type semiconductor layer 350 is connected with the second electrode 320. The plurality of first conductivity type semiconductor layers described above are arranged at intervals.

It should be noted that the above-mentioned "conductivity type" includes n type or p type. For example, the first conductivity type semiconductor layer can be an n-type semiconductor layer and the second conductivity type semiconductor layer can be a p-type semiconductor layer. Of course, the embodiments of the present disclosure include but are not limited thereto, and the first conductivity type semiconductor layer can be a p-type semiconductor layer and the second conductivity type semiconductor layer can be an n-type semiconductor layer. For example, in the case where the light emitting unit is a blue light emitting unit or a green light emitting unit, the first conductive type semiconductor layer is a p-type semiconductor layer and the second conductive type semiconductor layer is an n-type semiconductor layer; and in the case where the light emitting unit is a red light emitting unit, the first conductive type semiconductor layer is an n-type semiconductor layer and the second conductive type semiconductor layer is a p-type semiconductor layer.

For example, the first electrode 310 is a p-electrode, the first conductive type semiconductor layer 330 is a p-type semiconductor layer, the second electrode 320 is an n-electrode, and the second conductive type semiconductor layer 350 is an n-type semiconductor layer. Holes and electrons are injected into the second conductive type semiconductor layer 350 and the first conductive type semiconductor layer 330 from the second electrode 320 and the first electrode 310, respectively, and then recombine in the light emitting layer 340, which is expressed by releasing energy in the form of photons. The luminescent wavelength depends on the band gap of the luminescent material The present embodiment is not limited thereto, and the first electrode can be an n-electrode, the first conductive type semiconductor layer can be an n-type semiconductor layer, the second electrode can be a p-electrode, and the second conductive type semiconductor layer can be a p-type semiconductor layer.

For example, in some examples, the first conductive type semiconductor layer 330 is an n-type gallium nitride layer and the second conductive type semiconductor layer 350 is a p-type gallium nitride layer. Of course, the embodiments of the present disclosure include but are not limited thereto, and the first conductive type semiconductor layer 330 can be a p-type gallium nitride layer and the second conductive type semiconductor layer 350 can be an n-type gallium nitride layer.

For example, in the case where the light emitting unit is configured to emit blue light or green light, the first conductive type semiconductor layer and the second conductive type semiconductor layer can adopt gallium nitride (GaN) as described above. In the case where the light emitting unit is configured to emit red light, the first conductive type semiconductor layer and the second conductive type semiconductor layer can adopt gallium phosphide (GaP), aluminum gallium arsenide (AlGaAs) or aluminum gallium indium phosphide (AlGaInP). Of course, the embodiments of the present disclosure include but are not limited to these case, and the first conductive type semiconductor layer and the second conductive type semiconductor layer can also be made of other suitable materials.

For example, in some examples, the light emitting layer 340 described above includes a multi-quantum well layer (MQW), and the multi-quantum well layer includes a plurality of quantum wells, so that the luminous intensity and luminous efficiency of the light emitting unit can be improved. Of course, the embodiments of the present disclosure include but are not limited thereto, and the light emitting layer described above can also be any other suitable light emitting layer such as a quantum well layer or a PN junction.

For example, as shown in FIG. 2, the orthographic projections of the first electrode 310 and the second electrode 320 in each light emitting unit 300 on the base substrate 100 are overlapped with the orthographic projection of the second conductive type semiconductor layer 350 on the base substrate, and both the first electrode 310 and the second electrode 320 are located at one side of the second conductive type semiconductor layer 350 facing the base substrate 100.

For example, as shown in FIG. 2, the orthographic projection of the first conductive type semiconductor layer 330 on the base substrate 100 is substantially coincident with the orthographic projection of the first electrode 310 on the base substrate 100. The light emitting region of each light emitting sub-unit is related to a contact region between the first conductive type semiconductor layer and the light emitting layer, and a contact region between the first electrode and the first contact pad.

For example, as shown in FIG. 2, a buffer layer 360 is further disposed at one side of the second conductive type semiconductor layer 350 away from the first electrode 310, and the buffer layer can improve the quality of the second conductive type semiconductor layer 350.

For example, the light emitting unit provided by the embodiments of the present disclosure can be formed on a sapphire substrate, and the sapphire substrate is located at one side of the buffer layer away from the second conductive type semiconductor layer; and after the light emitting unit is transferred onto the backplane, the sapphire substrate can be lifted off to increase light exiting amount (in the case where the second conductive type semiconductor layer is located at the light exiting side).

For example, as shown in FIG. 2, in each light emitting unit 300, each light emitting sub-unit 301 includes one first electrode 310 and one first conductive type semiconductor layer 330, and the first electrode 310 in each light emitting sub-unit 301 is configured to be connected with one first contact pad 210. In each light emitting unit 300, the second electrode 320 is a common electrode shared by the plurality of light emitting sub-units 301, the second conductive type semiconductor layer 350 is a continuous film, and the second electrode 320 is configured to be connected with the second contact pad 220.

In the light emitting unit provided by the embodiments of the present disclosure, one first electrode, one first conductive type semiconductor layer, the light emitting layer, the second conductive type semiconductor layer and the second electrode can form one light emitting sub-unit. The second electrode can be a common electrode shared by at least two light emitting sub-units. Because the light emitting unit includes at least two first conductivity type semiconductor layers and at least two first electrodes, the light emitting unit can be formed with at least two light emitting sub-units which can emit light independently.

In the embodiments of the present disclosure, in the case where one light emitting unit includes a plurality of light emitting sub-units which can emit light independently, the plurality of light emitting sub-units can be transferred at one time in the process of transferring the light emitting unit onto the backplane, thereby improving the transfer efficiency.

For example, the light emitting unit in the embodiments of the present disclosure can be a micro LED or a mini LED. For example, the maximum size of each light emitting unit in the direction parallel to the base substrate can be 30 microns to 600 microns. For example, the maximum size of each light emitting unit in the direction parallel to the base substrate can refer to the diagonal length, side length or diameter, etc., of the planar shape of the light emitting unit parallel to the base substrate. For example, in the case where the shape of the light emitting unit is polygonal, the maximum size of each light emitting unit in the direction parallel to the base substrate can be the diagonal length of the polygon. For example, in the case where the shape of the light emitting unit is circular, the maximum size of each light emitting unit in the direction parallel to the base substrate can be a diameter.

On the one hand, in the case where the overall size of the light emitting diode remains unchanged, the size of a single light emitting sub-unit can be reduced by forming a plurality of light emitting sub-units in the light emitting diode. For example, light emitting diode chips with smaller size can be manufactured with existing process accuracy. Therefore, the light emitting unit provided by the embodiments of the present disclosure can reduce the manufacturing difficulty and cost of small-sized light emitting diodes by arranging a plurality of light emitting sub-units, and can also realize higher pixels per inch.

For example, as shown in FIG. 2, in each light emitting unit 300, each first electrode 310 connected with each first contact pad 210 includes a plurality of sub-electrodes 311 spaced apart from each other, the first conductive type semiconductor layer 330 includes a plurality of sub-semiconductor layers 331 spaced apart from each other, the plurality of sub-semiconductor layers 331 are in one-to-one correspondence with the plurality of sub-electrodes 311, and the light emitting layer 340 includes a plurality of sub-light emitting layers 341 spaced apart from each other, and the plurality of sub-light emitting layers 341 are in one-to-one correspondence with the plurality of sub-electrodes 311.

For example, as shown in FIG. 2, the orthographic projection of each sub-light emitting layer 341 on the base substrate 100 basically coincides with the orthographic projection of each sub-electrode 311 on the base substrate 100. For example, the orthographic projection of each sub-semiconductor layer 331 on the base substrate 100 basically coincides with the orthographic projection of each sub-electrode 311 on the base substrate 100. For example, each light emitting sub-unit 301 includes a plurality of nano-pillar structures 134, and each nano-pillar structure 134 at least includes one sub-electrode 311, one sub-semiconductor layer 331 and one sub-light emitting layer 341 which are stacked. FIG. 2 illustratively shows that one nano-pillar structure 134 includes one sub-electrode 311, one sub-semiconductor layer 331 and one sub-light emitting layer 341 which are stacked, but is not limited thereto. The nano-pillar structure in at least one light emitting unit can also include a part of the second conductive type semiconductor layer, that is, the second conductive type semiconductor layer can include a plurality of protrusions, each protrusion is a part of one nano-pillar structure, and a concave portion between adjacent protrusions is the concave portion between adjacent nano-pillar structures.

For example, the sizes of each sub-electrode 311 in the row direction and column direction are respectively smaller than the sizes of each first contact pad 210 in the row direction and column direction. For example, the orthographic projection of one first contact pad 210 on the base substrate 100 is overlapped with the orthographic projections of a plurality of sub-electrodes 311 on the base substrate 100. For example, the number of nano-pillar structures in contact with each first contact pad 210 is the same or there is little difference in the number of nano-pillar structures in contact with each first contact pad 210, so that the area of the light emitting region of each light emitting sub-unit is basically the same. For the nano-pillar structures in contact with one first contact pad, because the sizes of the nano-pillar structures and the distance between adjacent nano-pillar structures are small, in the case where the nano-pillar structures are in contact with one first contact pad, the contact region between each nano-pillar structure and the first contact pad emits light. And the contact region between each nano-pillar structure and the first contact pad covers at least a part of the gap between adjacent nano-pillar structures, so that in the case where the nano-pillar structures are electrically connected with the first contact pad, the light emitting region is an entire region covering the first contact pad, and the area of the light emitting region is basically equal to or even slightly greater than the area of the first contact pad. For example, for the plurality of nano-pillar structures in contact with one first contact pad, the light emitting region refers to a region when each nano-pillar structure works normally so that the light emitting layer corresponding to each nano-pillar structure can emit light normally; and when one nano-pillar structure fails to emit light normally among the nano-pillar structures in contact with one first contact pad, the light emitting region still represents the light emitting region when all nano-pillar structures in contact with one first contact pad work normally.

For example, as shown in FIG. 2, the distance between adjacent sub-electrodes 311 can be in a range from 100 nanometers to 50 micrometers. For example, the sizes of each sub-electrode 311 in the row direction and the column direction can be in a range from 100 nanometers to m50 micrometers.

In the embodiments of the present disclosure, the shape and size of the light emitting region of each light emitting sub-unit are determined by the shape and size of the contact region between the plurality of nano-pillar structures and each first contact pad. Because the size of each nano-pillar structure and the distance between adjacent nano-pillar structures are small, the light emitting region of each light emitting sub-unit is determined by the shape and size of the contact region between the plurality of nano-pillar structures and each first contact pad. Therefore, the size and position of the light emitting region of each light emitting sub-unit can be set by setting the size and position of the first contact pad.

For example, as shown in FIG. 1 and FIG. 2, each light emitting unit 300 includes light emitting sub-units 301 arranged in a plurality of rows and a plurality of columns, and each light emitting sub-unit 301 includes one first electrode 310, that is, each light emitting sub-unit 301 is configured to be connected with one first contact pad 210. For example, each row of light emitting sub-units 301 includes a plurality of light emitting sub-units 301 arranged along the row direction, and each column of light emitting sub-units 301 includes one light emitting sub-unit 301, and the orthographic projections of light emitting regions 3001 of two adjacent columns of light emitting sub-units 301 on the first straight line extending along the column direction are not overlapped; and in each light emitting unit 300, there is no gap between orthographic projections of the light emitting regions 3001 of the two adjacent columns of light emitting sub-units 301 on the second straight line extending along the row direction. In an embodiment of the present disclosure, the positional relationship of the plurality of first contact pads on the backplane is basically consistent with the positional relationship of light emitting regions of the plurality of light emitting sub-units on the display substrate including the backplane, so the size and position of the first contact pads 210 shown in FIG. 1 can also represent the size and position of the light emitting regions 3001 of the sub-light emitting units 301.

For example, the orthographic projections of the light emitting regions 3001 of the two adjacent columns of light emitting sub-units 301 on the second straight line are overlapped, or, the endpoints, which are close to each other, of the orthographic projections of the light emitting regions 3001 of the two adjacent columns of light emitting sub-units 301 on the second straight line coincide. For example, as shown in FIG. 1 and FIG. 2, in each light emitting unit 300, the orthographic projections of the light emitting regions 3001 of the two adjacent columns of light emitting sub-units 301 on the first side 101 are not overlapped, and there is no gap between the orthographic projections of the light emitting regions 3001 of two adjacent columns of light emitting sub-units 301 on the second side 102. The "light emitting regions of two adjacent columns of light emitting sub-units" mentioned above refers to two light emitting regions located in two adjacent columns, the two light emitting regions are located in different rows, and there is not any other light emitting region between the two columns of light emitting regions.

For example, as shown in FIG. 1 and FIG. 2, the distance between the light emitting regions 3001 of any two light emitting sub-units 301 located in the same row and adjacent to each other is equal.

For example, as shown in FIG. 1 and FIG. 2, the light emitting sub-units 301 arranged in the plurality of rows and the plurality of columns include N rows of light emitting sub-units 301, and the orthographic projection of the light emitting regions 3001 of the n-th row of light emitting sub-units 301 on the second straight line is located between the orthographic projection of the light emitting regions 3001 of the (n−1)-th row of light emitting sub-units 301 on the second straight line and the orthographic projection of the light emitting regions 3001 of the (n+1)-th row of light emitting sub-units 301 on the second straight line, or the orthographic projection of the light emitting region 3001 of the n-th row of light emitting sub-units 301 on the second straight line is located between the orthographic projection of the light emitting region 3001 of the (n−1)-th row of light emitting sub-units 301 on the second straight line and the orthographic projection of the light emitting region 3001 of the first row of light emitting sub-units 301 on the second straight line, where N>1 and 1<n≤N.

For example, as shown in FIG. 1 and FIG. 2, taking N=3 as an example, the orthographic projection of the light emitting regions 3001 of the second row of light emitting sub-units 301 on the second straight line is between the orthographic projection of the light emitting regions 3001 of the first row of light emitting sub-units 301 on the second straight line and the orthographic projection of the light emitting regions 3001 of the third row of light emitting sub-units 301 on the second straight line, and the orthographic projection of the light emitting regions 3001 of the third row of light emitting sub-units 301 on the second straight line is located between the orthographic projection of the light emitting regions 3001 of the second row of light emitting sub-units 301 on the second straight line and the orthographic projection of the light emitting regions 3001 of the first row of light emitting sub-units 301 on the second straight line. The embodiments of the present disclosure illustratively shows that each light emitting unit can include three rows of light emitting sub-units, but is not limited thereto. Each light emitting unit can include two rows of light emitting sub-units, or each light emitting unit can include four or more rows of light emitting sub-units, which is not limited in the embodiments of the present disclosure. The row number and column number of the light emitting sub-units can be determined according to the requirement and size of the actual product.

Figure 3:
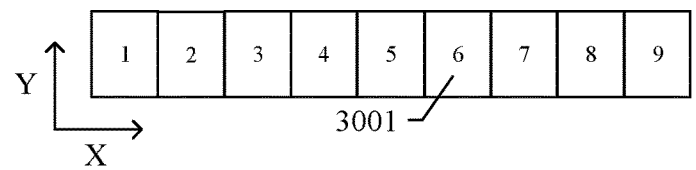
FIG. 3 is a view of visual effect of a light emitting region corresponding to one pixel region shown in FIG. 1.

FIG. 3 is a view of visual effect of a light emitting region corresponding to one pixel region shown in FIG. 1. As shown in FIGS. 1-3, according to the resolution limit of human eyes in terms of angle, the viewing effect presented by the arrangement of the light emitting region corresponding to each pixel region at a certain viewing distance is basically the same as the viewing effect of the light emitting regions 3001 arranged in a continuous row as shown in FIG. 3, and in the case where there is no gap between the orthographic projections of the light emitting regions 3001 of two adjacent columns of light emitting sub-units 301 on the second side 102, the light emitting regions 3001 of the light emitting sub-units 301 in each light emitting unit 300 are arranged as a line of light emitting regions 3001 without gaps in visual effect, so as to form a plurality of viewpoints which are continuous and have no black region in a horizontal direction.

Figure 4:
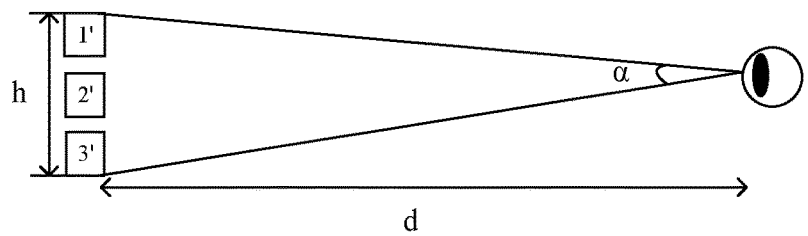
FIG. 4 is a principle diagram of visual effect of adjacent three columns of light emitting regions corresponding to one pixel region shown in FIG. 3.

FIG. 4 is a principle diagram of visual effect of adjacent three columns of light emitting regions corresponding to one pixel region shown in FIG. 3. As shown in FIG. 4, assuming that the light emitting region 1, the light emitting region 2 and the light emitting region 3 shown in FIG. 1 are arranged as a column of the light emitting region 1', the light emitting region 2' and the light emitting region 3' along the Y direction, that the size of each light emitting region in the Y direction is 10 microns, and that the distance between two adjacent light emitting regions (e.g., the light emitting region 2' and the light emitting region 3', or the light emitting region 2' and the light emitting region 1') is 2 microns, the total size h of the three light emitting regions in the Y direction is 34 microns. The minimum visual angle α of human eyes in the Y direction is 1 arc minute, and according to the formula tan(α/2)=h/2d, when the distance d between human eyes and the light emitting regions is greater than 116.88 mm, the positions of the light emitting region 1', the light emitting region 2' and the light emitting region 3' which are arranged in three rows cannot be distinguished by human eyes. For example, the light emitting region 1', the light emitting region 2' and the light emitting region 3' are overlapped in the same position in human eyes. In the case where the light emitting region 1', the light emitting region 2' and the light emitting region 3' located in different rows are staggered in the row direction, such as the light emitting region 1, the light emitting region 2 and the light emitting region 3 which are respectively located in different columns as shown in FIG. 1, when the distance d between human eyes and the light emitting regions 3001 is greater than 116.88 mm, the light emitting regions 3001 located in different rows cannot be distinguished by human eyes, and the light emitting region 1, the light emitting region 2 and the light emitting region 3 will be arranged as light emitting regions in the same row and without gaps in visual effect. That is, the light emitting regions 3001 in each light emitting unit 300 is arranged as light emitting regions in one row and without gaps in visual effect.

In the case where the backplane shown in FIG. 1 is applied to display, the contact region between the first contact pad and the corresponding light emitting unit is a light emitting region. For example, the size of the first contact pad is the same as the size of the light emitting region, and a relatively small light emitting region can meet the brightness requirement. In the case where there is no gap between the orthographic projections of two adjacent columns of first contact pads on the second side of the base substrate, in the case of a certain viewing distance, the two adjacent columns of light emitting regions are arranged as a line of light emitting regions without gaps in visual effect, which can prevent moire during display, thus improving display effect.

Compared with arranging the first contact pads in each pixel region directly in the arrangement structure shown in FIG. 3, the embodiment of the present disclosure arranges the first contact pads in each pixel region into a multi-row structure, which can reduce the bonding accuracy between the light emitting units and the first contact pads on the backplane, and is beneficial to reducing the transfer accuracy of the light emitting units.

For example, in an example of the embodiments of the present disclosure, a light splitting device 400 is provided at the light exiting side of the light emitting units, so as to split light emitted from the plurality of light emitting units to different viewpoint regions, thereby forming different display information in space. And when human eyes receive different display information in space, 3D display effect can be perceived. For example, the light splitting device can include a cylindrical mirror or a lens to control the light direction.

Figure 5:
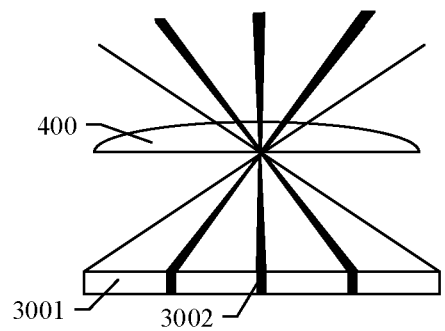
FIG. 5 is a schematic diagram of 3D display in the case where there is a gap between adjacent light emitting regions in a light emitting unit.
Figure 6:
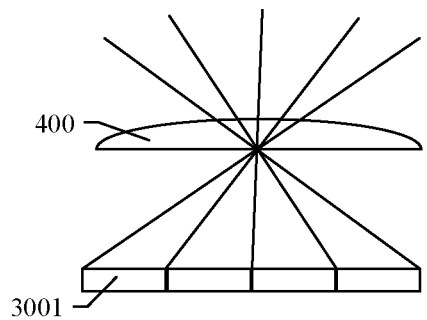
FIG. 6 is a schematic diagram of 3D display in the case where there is no gap between adjacent light emitting regions in a light emitting unit.

For example, FIG. 5 is a schematic diagram of 3D display in the case where there is a gap between adjacent light emitting regions in the light emitting unit, and FIG. 6 is a schematic diagram of 3D display in the case where there is no gap between adjacent light emitting regions in a light emitting unit. As shown in FIG. 5, there are gaps 3002 between the plurality of light emitting regions 3001 of the plurality of light emitting sub-units included in each light emitting unit; when the display substrate including the light emitting unit is applied to 3D display, the existence of the gaps 3002 between adjacent light emitting regions will cause black regions to be formed between the plurality of viewpoint regions formed after light passes through the light splitting device 400, and when human eyes switch among different viewpoint regions, moire will be observed, thus affecting the viewing experience. As shown in FIG. 6, in the case where the plurality of light emitting regions 3001 of the plurality of light emitting sub-units included in each light emitting unit are arranged in the arrangement manner shown in FIGS. 1-3, there is basically no gap between adjacent light emitting regions 3001; when the display substrate including the light emitting unit is applied to 3D display, no black region will be formed between the plurality of viewpoint regions formed after the image light emitted from adjacent light emitting regions 3001 passes through the light splitting device 400, thus solving the problem that human eyes observe moire when switching among different viewpoint regions and improving the viewing experience.

For example, in the case where the orthographic projections of two adjacent columns of first contact pads on the second straight line are overlapped, there may also exist cases of partial overlapping between two adjacent light emitting regions among the light emitting regions arranged in a line in visual effect, but the subsequent display is basically not affected. In the case where the endpoints, which are close to each other, of the orthographic projections of two adjacent columns of first contact pads on the second straight line coincide, the edges of two adjacent light emitting regions in the light emitting regions arranged in a line in visual effect also basically coincide.

For example, as shown in FIG. 2, the pitch a of adjacent sub-electrodes 311 (i.e., nano-pillar structures) along the row direction is less than the distance b between adjacent first contact pads 210 arranged along the row direction. The pitch of the sub-electrodes arranged along the row direction includes the size of one sub-electrode along the row direction and the distance between two adjacent sub-electrodes. Because the size of the first contact pad on the backplane determines the size of the light emitting region, by setting the pitch of the sub-electrodes to be less than the distance between adjacent first contact pads, it can prevent the same sub-electrode from contacting with the two first contact pads, resulting in interference between different sub-electrodes.

For example, the magnitude of the pitch a along the row direction is in a range from 200 nm to 100 microns, and the distance b between adjacent first contact pads 210 arranged along the row direction is in a range from 5 microns to 1000 microns.

Figure 7A:
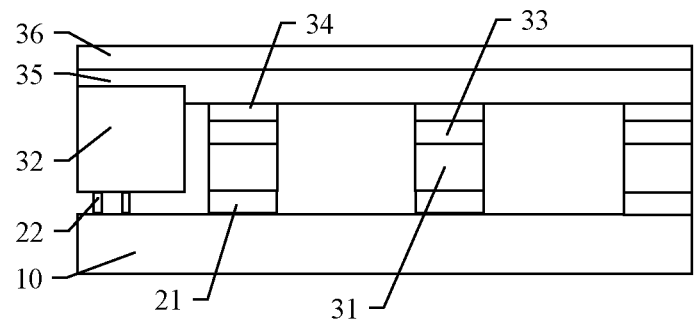
FIG. 7A is a partial cross-sectional structural view of normal bonding between a light emitting unit and a backplane.
Figure 7B:
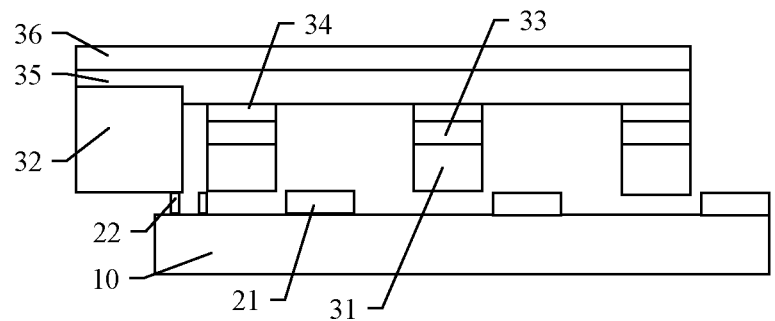
FIG. 7B is a schematic diagram of the case where bonding deviation occurs between the light emitting unit and the backplane shown in FIG. 7A.
Figure 8A:
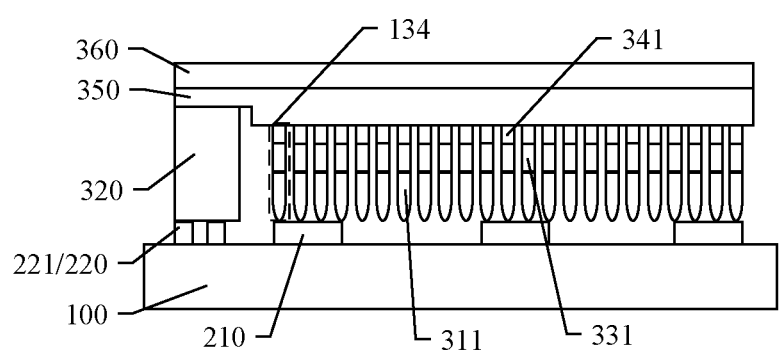
FIG. 8A is a partial cross-sectional structural view of normal bonding between the light emitting unit and the backplane shown in FIGS. 1-3.

FIG. 7A is a partial cross-sectional structural view of normal bonding between a light emitting unit and a backplane; FIG. 7B is a schematic diagram of the case where bonding deviation occurs between the light emitting unit and the backplane shown in FIG. 7A; FIG. 8A is a partial cross-sectional structural view of normal bonding between the light emitting unit and the backplane shown in FIGS. 1-3, FIG. 8B is a schematic diagram of the case where bonding deviation occurs between the light emitting unit and the backplane shown in FIG. 8A. As shown in FIG. 7A and FIG. 7B, the plurality of light emitting sub-units in each light emitting unit share the second electrode 32 and the second conductive type semiconductor layer 35, and a buffer layer 36 is provided at one side of the second conductive type semiconductor layer 35 away from the backplane. The first electrodes 31 in different light emitting sub-units are spaced apart from each other, the first conductive type semiconductor layers 33 in different light emitting sub-units are spaced apart from each other, and the light emitting layers 34 in different light emitting sub-units are spaced apart from each other. In the case where the first electrode 31 in each light emitting sub-unit has a continuous structure, both the first conductive type semiconductor layer 33 and the light emitting layer 34 in each light emitting sub-unit have a continuous structure.

For example, the shape of each first electrode 31 can be substantially the same as the shape of the first contact pad 21, and the size of each first electrode 31 can be substantially the same as the size of the first contact pad 21. For example, as shown in FIG. 7A, in the case where the light emitting unit is normally bonded to the backplane, the orthographic projection of the first electrode 31 on the base substrate 10 of the backplane substantially coincides with the orthographic projection of the first contact pad 21 on the base substrate 10, so as to realize electrical connection, or the orthographic projection of each first electrode 31 on the base substrate 10 of the backplane is only overlapped with the orthographic projection of a corresponding first contact pad 21 on the base substrate 10, so as to realize electrical connection. For example, as shown in FIG. 7B, in the case where bonding deviation occurs between the light emitting unit and the backplane, the first electrode 31 of each light emitting sub-unit may be misaligned with a corresponding first contact pad 21. For example, the orthographic projections of the first electrode 31 and the corresponding first contact pad 21 on the base substrate 10 are not overlapped, or the overlapping area between the orthographic projections of the first electrode 31 and the corresponding first contact pad 21 on the base substrate 10 is small, which leads to connection failure between the light emitting sub-unit and the corresponding first contact pad 21. Similarly, in the case where bonding deviation occurs between the light emitting unit and the backplane, the second electrode 32 and the second contact pad 22 may also be misaligned, resulting in the problem of electrical connection failure.

Figure 8B:
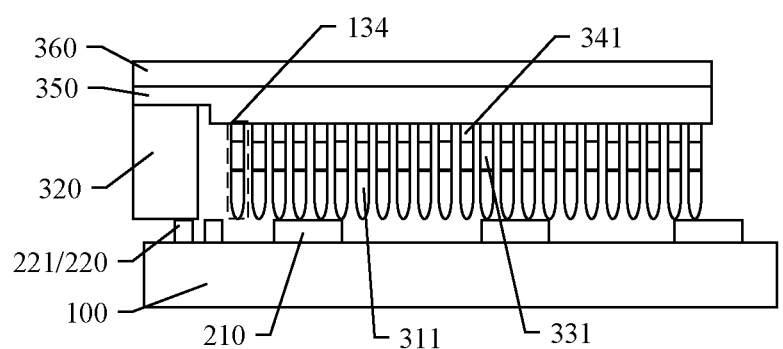
FIG. 8B is a schematic diagram of the case where bonding deviation occurs between the light emitting unit and the backplane shown in FIG. 8A.

For example, as shown in FIG. 8A, in the case where the backplane and the light emitting unit provided by an embodiment of the present disclosure is normally bonded, the effect thereof is basically the same as the effect of the case that the light emitting unit is normally bonded to the backplane as shown in FIG. 7A. As shown in FIG. 8B, the nano-pillar structures in the light emitting unit provided by an embodiment of the present disclosure are small in size and independent of each other, by adjusting the distance between the first electrode closest to the second electrode in the light emitting unit and the second electrode to be greater than the transfer accuracy of the equipment, the requirements for the transfer accuracy in the process of bonding the light emitting unit to the backplane can be effectively reduced.

For example, as shown in FIG. 1, FIG. 2, FIG. 8A and FIG. 8B, the second electrode 320 in each light emitting unit 300 is a continuous entire electrode, and the alignment accuracy between the second electrodes 320 and the second contact pads 220 can be reduced by arranging each second contact pad 220 electrically connected with each second electrode 320 on the backplane to include a plurality of second sub-contact pads 221 (e.g., the size of the second sub-contact pad 221 is as small as possible). For example, the size of the second sub-contact pad 221 can be 2.5 μm*2.5 μm.

Figure 9:
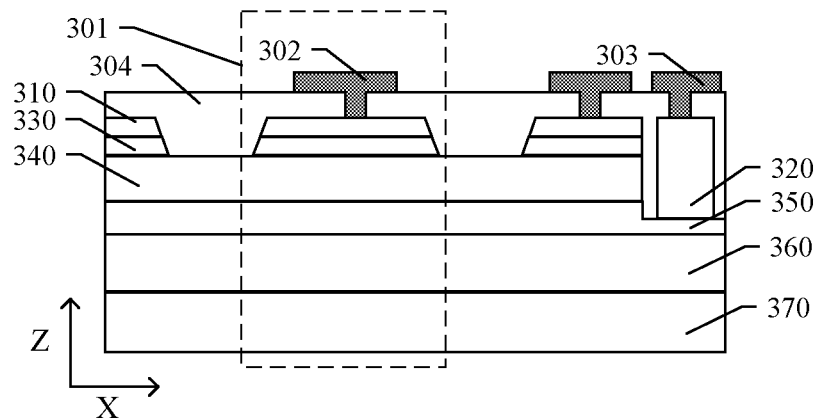
FIG. 9 is a partial structural view of a light emitting unit of a display substrate according to another embodiment of the present disclosure.
Figure 10:
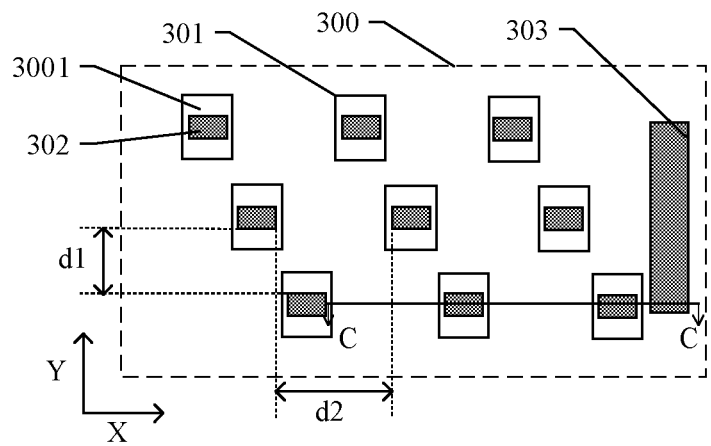
FIG. 10 is a planar structural view of the light emitting unit of the display substrate shown in FIG. 9.

FIG. 9 is a partial structural view of a light emitting unit of a display substrate according to another embodiment of the present disclosure, and FIG. 10 is a planar structural view of the light emitting unit of the display substrate shown in FIG. 9. FIG. 9 is a partial cross-sectional structural view taken along line CC shown in FIG. 10. As shown in FIG. 9 and FIG. 10, the display substrate in the present embodiment is different from the embodiment shown in FIG. 1 and FIG. 2 in that: the light emitting layer 340 in each light emitting unit 300 of the display substrate is a continuous film, that is, the display substrate does not include a plurality of sub-light emitting layers spaced apart from each other; the first electrodes 310 in the light emitting sub-units 301 included in each light emitting unit 300 are an entire electrode, that is, light emitting unit 300 does not include a plurality of sub-electrodes spaced apart from each other; and the first conductivity type semiconductor layer 330 in each light emitting sub-unit 301 is an entire film, that is, the first conductivity type semiconductor layer 330 does not include a plurality of sub-semiconductor layers spaced apart from each other. That is, each light emitting sub-unit does not include the nano-pillar structure.

For example, as shown in FIG. 9 and FIG. 10, in the display substrate, each light emitting unit 300 includes light emitting sub-units 301 arranged in a plurality of rows and a plurality of columns, and each light emitting sub-unit 301 includes one first electrode 310, that is, each light emitting sub-unit 301 is configured to be connected with one first contact pad.

For example, the light emitting region 3001 of each light emitting sub-unit 301 is a region where each first conductivity type semiconductor layer 330 is in contact with the light emitting layer 340. For example, each row of light emitting sub-units 301 includes a plurality of light emitting sub-units 301 arranged along the row direction, and each column of light emitting sub-units 301 includes one light emitting sub-unit 301, and the orthographic projections of light emitting regions 3001 of two adjacent columns of light emitting sub-units 301 on a first straight line extending along the column direction are not overlapped; and in each light emitting unit 300, there is no gap between orthographic projections of the light emitting regions 3001 of the two adjacent columns of light emitting sub-units 301 on a second straight line extending along the row direction.

For example, as shown in FIG. 9 and FIG. 10, the distance between the light emitting regions 3001 of any two light emitting sub-units 301 located in the same row and adjacent to each other is equal.

For example, as shown in FIG. 9 and FIG. 10, taking that the plurality of light emitting sub-units 301 in each light emitting unit 300 are arranged in three rows as an example, the orthographic projection of the light emitting regions 3001 of the second row of light emitting sub-units 301 on the second straight line is between the orthographic projection of the light emitting regions 3001 of the first row of light emitting sub-units 301 on the second straight line and the orthographic projection of the light emitting regions 3001 of the third row of light emitting sub-units 301 on the second straight line, and the orthographic projection of the light emitting regions 3001 of the third row of light emitting sub-units 301 on the second straight line is located between the orthographic projection of the light emitting regions 3001 of the second row of light emitting sub-units 301 on the second straight line and the orthographic projection of the light emitting regions 3001 of the first row of light emitting sub-units 301 on the second straight line.

The light emitting regions in the display substrate in the embodiment of the present disclosure are substantially arranged in the same way as the first contact pads (which are also light emitting regions) in the display substrate shown in FIG. 1, and therefore, the viewing effect of the light emitting regions of the light emitting sub-units in the display substrate at a certain viewing distance is basically the same as the viewing effect of the light emitting regions arranged in a continuous row as shown in FIG. 3, which can prevent moire during display, thus improving display effect.

For example, as shown in FIG. 9 and FIG. 10, a first electrode contact pad 302 connected with the first electrode 310 is provided at one side of the first electrode 310 away from the second conductivity type semiconductor layer 350, and the first electrode contact pad 302 is configured to be connected with the first contact pad to realize the connection between the first electrode and the first contact pad when the light emitting unit is bonded to the backplane. A second electrode contact pad 303 connected with the second electrode 320 is provided at one side of the second electrode 320 away from the second conductive type semiconductor layer 350, and the second electrode contact pad 303 is configured to be connected with the second contact pad to realize the connection between the second electrode and the second contact pad when the light emitting unit is bonded to the backplane.

For example, as shown in FIG. 9, an insulating layer 304 is provided at one side of the first electrode 310 away from the second conductive type semiconductor layer 350, the first electrode contact pad 302 is connected with the first electrode 310 through a via hole in the insulating layer 304, and the second electrode contact pad 303 is connected with the second electrode 320 through a via hole in the insulating layer 304.

For example, as shown in FIG. 10, the distance d1 between the first electrode contact pads 302 in two adjacent columns of light emitting sub-units 301 along the Y direction is the difference between the pitch of the light emitting sub-units 301 and the size of the first electrode contact pad 302 along the Y direction, where the pitch includes the length of the light emitting region 3001 of the light emitting sub-unit 301 along the Y direction and the distance between the two adjacent columns of light emitting regions 3001; the distance d2 between the first electrode contact pads 302 in two adjacent light emitting units 301 of the same row along the X direction is, for example, greater than or equal to the sum of the widths of the light emitting regions 3001 of the two light emitting units 301.

Compared with arranging the plurality of light emitting sub-units in each light emitting unit directly in the arrangement structure shown in FIG. 3, the embodiment of the present disclosure arranges the plurality of first electrode contact pads in each pixel region into a multi-row structure, so that the distance between the first contact pad and the second contact pad, the distance between two adjacent first electrode contact pads in the same row, and the distance between two adjacent columns of first electrode contact pads, can all be adjusted. For example, the distances as mentioned above can all be arranged relatively large, thereby reducing the requirement of transfer accuracy. In this case, the equipment used for picking up and transferring, for example, LEDs with a size of above 100 μm, can be adopted to realize picking up and transferring, for example, LEDs with a size of below 100 μm, and the transfer efficiency is effectively improved.

For example, the light emitting sub-unit can be a light emitting diode, and its size can be 15 μm×25 μm. For example, the bonding between the first electrode contact pad and the contact pad on the backplane, and the bonding between the second electrode contact pad and the contact pad on the backplane can be carried out by means of eutectic bonding, solder paste or anisotropic conductive adhesive, without being limited here. For example, the above bonding process can adopt a flip chip bonding method.

For example, as shown in FIG. 9, the display substrate further includes a substrate 370 located at one side of the light emitting layer 340 away from the first electrode 310. The substrate 370, is, for example, a sapphire substrate located at the light exiting side of the light emitting sub-units, that is, the light emitted from the light emitting layer 340 can pass through the substrate and then enter the eyes of an observer, and after the light emitting diode is bonded onto the backplane, whether or not to remove the sapphire substrate can be determined as needed, without being limited here.

In the embodiment of the present disclosure, one first electrode, one first conductive type semiconductor layer, the second conductive type semiconductor layer and the light emitting layer can form one light emitting sub-unit. Because the light emitting unit includes at least two first conductivity type semiconductor layers and at least two first electrodes, the light emitting unit can be formed with at least two light emitting sub-units which can emit light independently.

In the embodiments of the present disclosure, in the case where one light emitting unit includes a plurality of light emitting sub-units which can emit light independently, the plurality of light emitting sub-units can be transferred at one time in the process of transferring the light emitting unit onto the backplane, thereby improving the transfer efficiency.

In the embodiments of the present disclosure, the light emitting region of the light emitting sub-unit is determined by the contact region between the first conductive type semiconductor layer and the light emitting layer, so the distribution manner of the first contact pads on the backplane can be the same as or different from the distribution manner of the first contact pads shown in FIG. 1, as long as each first electrode can be electrically connected with the corresponding first contact pad through the first electrode contact pad.

Figure 11:
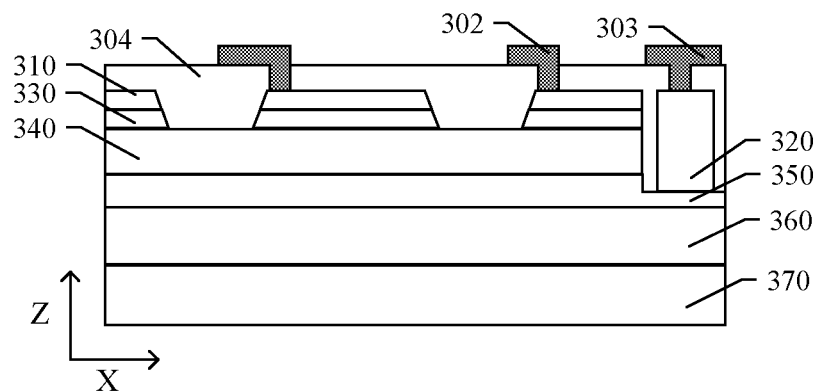
FIG. 11 is a partial structural view of a light emitting unit of a display substrate according to another embodiment of the present disclosure.
Figure 12:
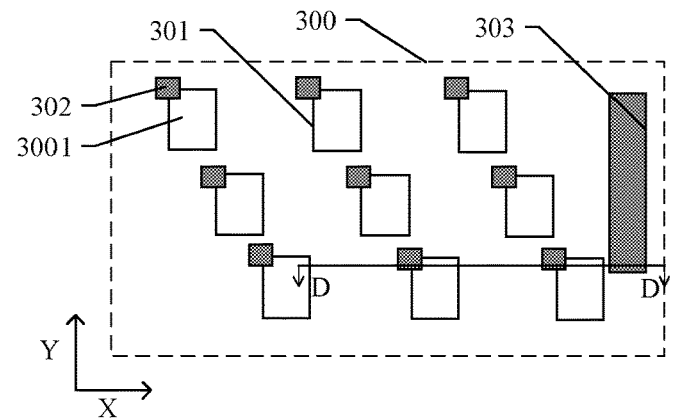
FIG. 12 is a planar structural view of the light emitting unit of the display substrate shown in FIG. 11.

FIG. 11 is a partial structural view of a light emitting unit of a display substrate according to another embodiment of the present disclosure, and FIG. 12 is a planar structural view of the light emitting unit of the display substrate shown in FIG. 11. FIG. 11 is a partial cross-sectional structural view taken along line DD shown in FIG. 12. As shown in FIG. 11 and FIG. 12, the display substrate in the present embodiment is different from the embodiment shown in FIG. 9 and FIG. 10 in that: the light emitted from the light emitting layer 340 of the display substrate passes through the first electrode 310 and then is incident to the eyes of the observer, so the first electrode 310 needs to have better light transmittance.

For example, the material of the first electrode 310 can be indium tin oxide (ITO). For example, the first electrode contact pad 302 disposed at one side of the first electrode 310 away from the light emitting layer 340 is electrically connected with the first electrode 310 through a through hole located at the edge of the first electrode 310 and in the insulating layer 304. For example, the material of the first electrode contact pad 302 can be titanium, aluminum, nickel, gold, copper, indium, zinc, silver, or zinc alloy, etc., the embodiments of the present disclosure are limited thereto.

For example, as shown in FIG. 11 and FIG. 12, in the display substrate, each light emitting unit 300 includes light emitting sub-units 301 arranged in a plurality of rows and a plurality of columns, and each light emitting sub-unit 301 includes one first electrode 310, that is, each light emitting sub-unit 301 is configured to be connected with one first contact pad.

For example, the light emitting region 3001 of each light emitting sub-unit 301 is a region where each first conductivity type semiconductor layer 330 is in contact with the light emitting layer 340. For example, each row of light emitting sub-units 301 includes a plurality of light emitting sub-units 301 arranged along the row direction, and each column of light emitting sub-units 301 includes one light emitting sub-unit 301, and the orthographic projections of light emitting regions 3001 of two adjacent columns of light emitting sub-units 301 on a first straight line extending along the column direction are not overlapped; and in each light emitting unit 300, there is no gap between orthographic projections of the light emitting regions 3001 of the two adjacent columns of light emitting sub-units 301 on a second straight line extending along the row direction.

For example, as shown in FIG. 11 and FIG. 12, the distance between the light emitting regions 3001 of any two light emitting sub-units 301 located in the same row and adjacent to each other is equal.

For example, as shown in FIG. 11 and FIG. 12, taking that the plurality of light emitting sub-units 301 in each light emitting unit 300 are arranged in three rows as an example, the orthographic projection of the light emitting regions 3001 of the second row of light emitting sub-units 301 on the second straight line is between the orthographic projection of the light emitting regions 3001 of the first row of light emitting sub-units 301 on the second straight line and the orthographic projection of the light emitting regions 3001 of the third row of light emitting sub-units 301 on the second straight line, and the orthographic projection of the light emitting regions 3001 of the third row of light emitting sub-units 301 on the second straight line is located between the orthographic projection of the light emitting regions 3001 of the second row of light emitting sub-units 301 on the second straight line and the orthographic projection of the light emitting regions 3001 of the first row of light emitting sub-units 301 on the second straight line.

The light emitting regions in the display substrate in the embodiment of the present disclosure are substantially arranged in the same way as the first contact pads (which are also light emitting regions) in the display substrate shown in FIG. 1, and therefore, the viewing effect of the light emitting regions of the light emitting sub-units in the display substrate at a certain viewing distance is basically the same as the viewing effect of the light emitting regions arranged in one continuous row as shown in FIG. 3, which can prevent moire during display, thus improving display effect.

Compared with arranging the plurality of light emitting sub-units in each light emitting unit directly in the arrangement structure shown in FIG. 3, the embodiment of the present disclosure arranges the plurality of first electrode contact pads in each pixel region into a multi-row structure, so that the distance between the first contact pad and the second contact pad, the distance between two adjacent first electrode contact pads in the same row, and the distance between two adjacent columns of first electrode contact pads, can all be adjusted. For example, the distances as mentioned above can all be arranged relatively large, thereby reducing the requirement of transfer accuracy. In this case, the equipment used for picking up and transferring LEDs with a size of above 100 μm, can be adopted to realize picking up and transferring LEDs with a size of below 100 μm, and the transfer efficiency is effectively improved.

In the embodiments of the present disclosure, the light emitting region of the light emitting sub-unit is determined by the contact region between the first conductive type semiconductor layer and the light emitting layer, so the distribution manner of the first contact pads on the backplane can be the same as or different from the distribution manner of the first contact pads shown in FIG. 1, as long as each first electrode can be electrically connected with the corresponding first contact pad through the first electrode contact pad.

Figure 13:
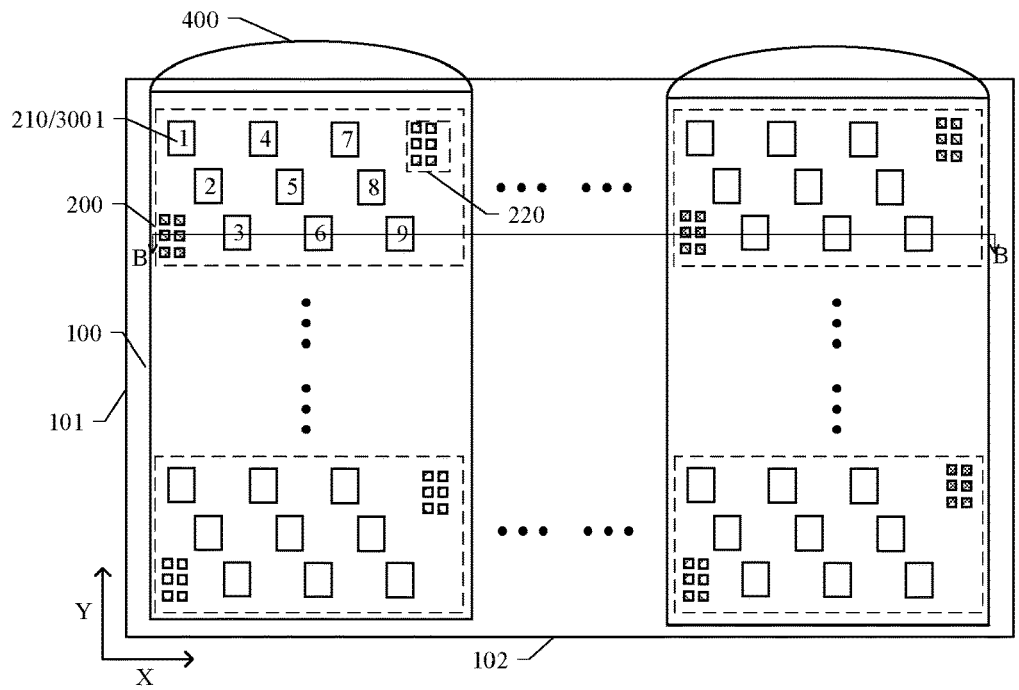
FIG. 13 is a planar structural view of a display substrate according to an embodiment of the present disclosure.
Figure 14:
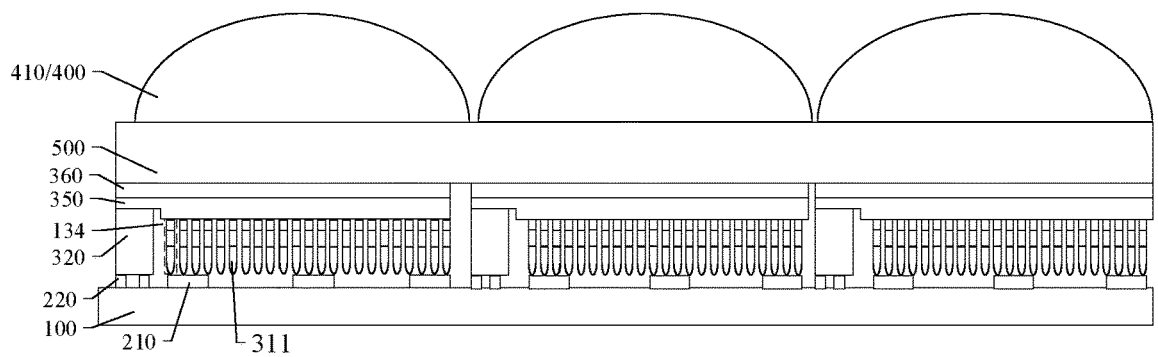
FIG. 14 is a partial cross-sectional structural view taken along line BB shown in FIG. 13.
Figure 15:
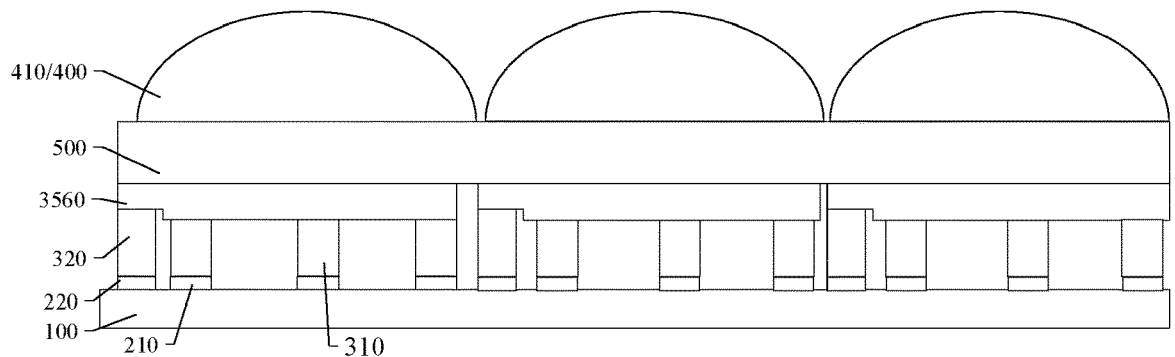
FIG. 15 is a schematic diagram of arranging a light splitting device at a light exiting side of the light emitting unit shown in FIG. 9.
Figure 16:
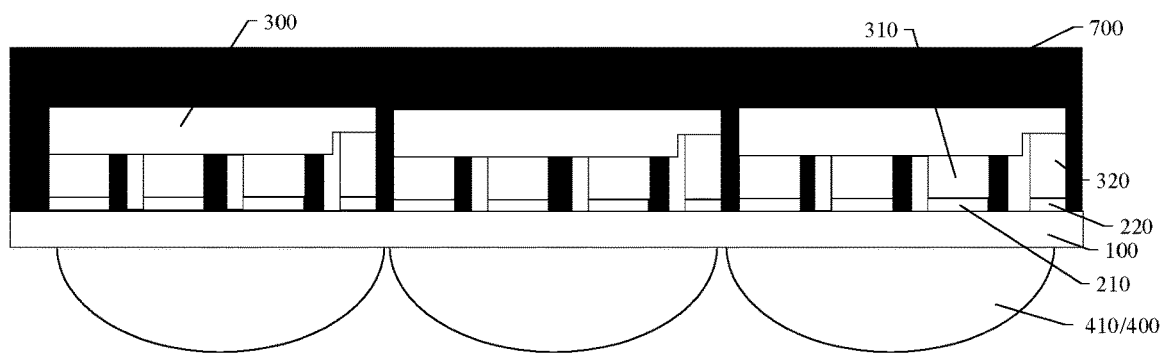
FIG. 16 is a schematic diagram of arranging a light splitting device at a light exiting side of the light emitting unit shown in FIG. 11.

FIG. 13 is a planar structural view of a display substrate according to an embodiment of the present disclosure, and FIG. 14 is a partial cross-sectional structural view taken along line BB shown in FIG. 13. FIG. 14 is a schematic diagram of arranging a light splitting device at a light exiting side of the light emitting unit shown in FIG. 2, FIG. 15 is a schematic diagram of arranging a light splitting device at a light exiting side of the light emitting unit shown in FIG. 9, and FIG. 16 is a schematic diagram of arranging a light splitting device at a light exiting side of the light emitting unit shown in FIG. 11. As shown in FIGS. 13-16, the display substrate further includes a light splitting device 400 located at the light exiting side of the plurality of light emitting units to split light emitted from the plurality of light emitting sub-units to different viewpoint regions, and the light splitting device 400 is the light splitting device 400 shown in FIG. 5. For example, the light splitting device 400 includes a plurality of lenses 410 arranged along the row direction, and the orthographic projection of each lens 410 on the base substrate 100 is overlapped with the orthographic projection of one column of pixel regions 200 on the base substrate 100. For example, the orthographic projection of each lens 410 on the base substrate 100 is overlapped with the orthographic projection of one column of light emitting units on the base substrate 100. For example, the width of each lens 410 is basically consistent with the width of the light emitting regions of one column of light emitting units, so that the light emitted from each column of light emitting units can exit through the corresponding lens.

For example, as shown in FIG. 13, one column of light emitting units corresponding to one lens 410 can include a blue light emitting unit, a green light emitting unit, and a red light emitting unit which are arranged in sequence. For example, one row of light emitting units arranged along the row direction can be light emitting units emitting light of the same color.

For example, as shown in FIGS. 13-16, the row number of light emitting sub-units in each light emitting unit can be determined according to the required number of viewpoint regions for 3D display. For example, in the case where the number of viewpoint regions is 90, the number of light emitting sub-units in each light emitting unit is 90, the light emitting sub-units can be arranged in 3 rows, and the number of light emitting sub-units in each row is 30; or, the light emitting sub-units can be arranged in 9 rows, and the number of light emitting sub-units in each row is 10, which is not limited in the embodiment of the present disclosure.

For example, as shown in FIG. 14 and FIG. 15, a planarization layer 500 is further provided between the light emitting units and the light splitting device 400 to realize a planarization treatment of the light emitting units. For convenience of illustration, FIG. 15 illustratively shows the second conductivity type semiconductor layer and the buffer layer 360 as an integral structure layer 3560.

For example, as shown in FIG. 16, the light splitting device 400 is arranged at one side of the base substrate 100 of the backplane away from the light emitting units 300. In order to effectively avoid the problem of crosstalk caused by reflection and refraction of light emitted from the light emitting sub-units in each film, a light shielding layer 700 can be disposed at least one of between adjacent light emitting units 300, at one side of the light emitting units 300 away from the backplane and between adjacent first electrodes 310, so as to effectively absorb unnecessary reflected light and refracted light. In some cases, a light absorbing structure can be arranged between adjacent light emitting units, and a reflective layer can be arranged at one side of the light emitting units away from the backplane to improve the light efficiency of the display substrate.

For example, as shown in FIG. 13 and FIG. 14, in the case where each light emitting sub-unit includes a plurality of first electrodes 310, that is, in the case where each light emitting sub-unit includes a plurality of nano-pillar structures, the position of the light emitting region 3001 of each light emitting sub-unit is determined by the position of the first contact pad 210 on the backplane. When aligning the light emitting region 3001 with the lens 410, the lens 410 can be directly aligned with the first contact pad 210 to improve the alignment accuracy. Compared with a display substrate in which the light emitting region is determined by the position of the light emitting unit, the embodiment of the present disclosure directly aligns the lens with the first contact pad on the backplane, so that the alignment deviation between the lens and the light emitting region will not occur due to the alignment deviation during the transfer process of the light emitting unit.

Figure 17:
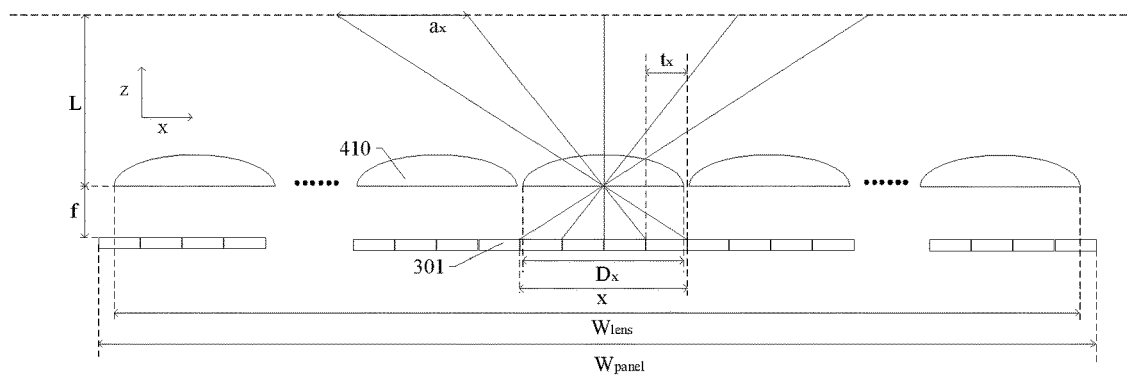
FIG. 17 is a schematic diagram of a light path of the display substrate shown in FIGS. 14-16.

FIG. 17 is a schematic diagram of a light path of the display substrate shown in FIGS. 14-16. As shown in FIG. 17, taking that each light emitting unit includes four light emitting sub-units 301 as an example, the light emitted from the four light emitting sub-units 301 forms four viewpoint regions after passing through lenses 410, and each lens 410 has a certain shrinkage relationship with respect to the size of a corresponding light emitting unit, and the shrinkage ratio satisfies a relationship of $D_x/x=W_{lens}/W_{panel}=L/(L+f)=$ 99.979%. L is the optimal viewing distance, for example, 350 mm; f is the focal length of the lens 410; $D_x$ is the aperture of the lens 410; x is the size of the light emitting unit along the X direction; $W_{lens}$ is the length of the lens array along the X direction; $W_{panel}$ is the length of the display substrate along the X direction. For example, the light emitting unit is located on the focal plane of the lens.

For example, as shown in FIG. 17, the light emitted from the light emitting sub-unit 301 has a width $a_x$ along the X direction at the optimal viewing distance after passing through the lens 410, and the width of the light emitting sub-unit 301 along the X direction is $t_x$, and they satisfy the following relationship: $a_x/t_x=L/f$, then $a_x=t_x*L/f$. For example, $a_x$ needs to be smaller than the interpupillary distance of human eyes, so as to ensure that the two eyes of the observer are in different viewpoint regions, thus generating parallax and realizing 3D viewing effect.

Figure 18:
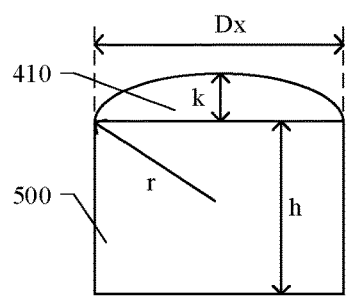
FIG. 18 is a cross-sectional structural view of a lens and a planarization layer shown in FIG. 17.

FIG. 18 is a cross-sectional structural view of a lens and a planarization layer shown in FIG. 17. As shown in FIG. 17, the lens 410 includes a curved surface away from the light emitting unit and a planar surface facing the light emitting unit, the refractive index of the lens 410 is n, the curvature radius r of the curved surface and the focal length f of the lens 410 satisfy $r=f*(n-1)$, and the thickness k of the lens 410 satisfies $k=r-[r^2-(D_x/2)^2]^{1/2}$. As shown in FIG. 18, a planarization layer 500 is provided between the lens 410 and the light emitting unit, and the thickness of the planarization layer 500 is h and the refractive index thereof is $n_0$, so that the optical path of light emitted from the light emitting unit in the planarization layer satisfies $l=n_0*h$, and the focal length f of the lens 410 is equal to the above optical path l. For example, the lens 410 and the planarization layer 500 can be made of the same material, and the refractive index n of the lens 410 is equal to the refractive index no of the planarization layer 500. Therefore, the distance between the lens and the light emitting unit can be determined according to the width and focal length of the lens, and the focal length of the lens can be determined by the processing ability of the lens.

Figure 19:
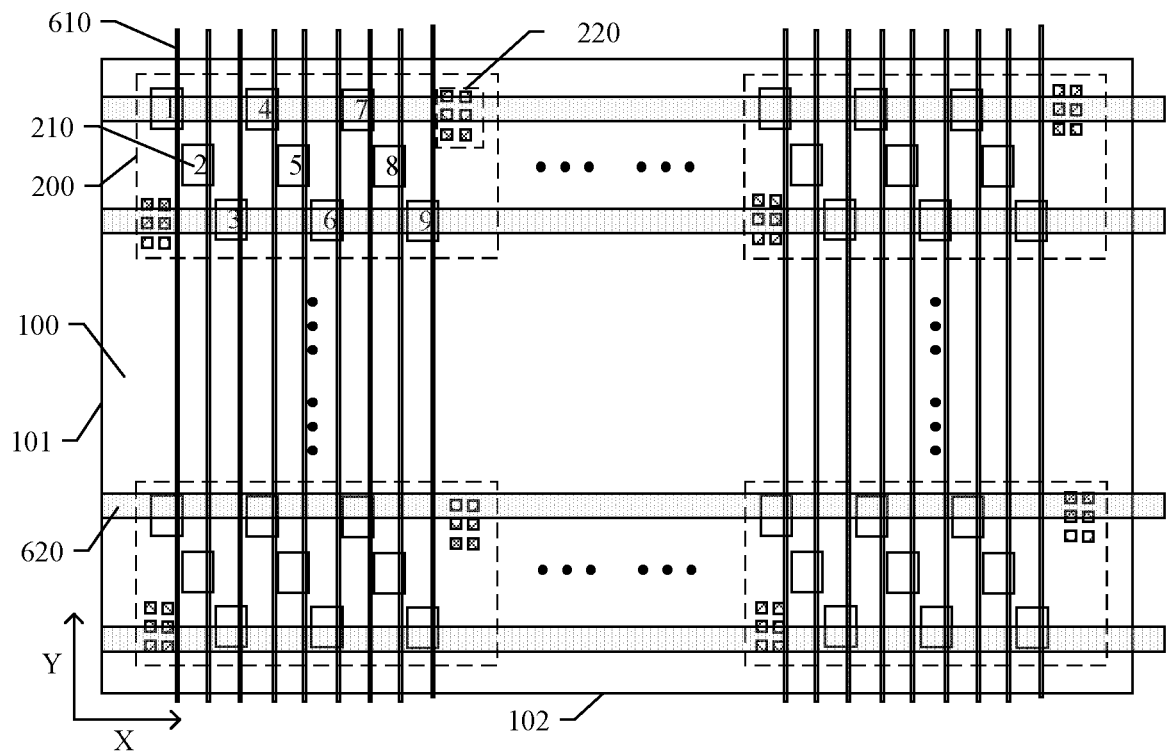
FIG. 19 is a schematic diagram of a driving mode of a display substrate according to an embodiment of the present disclosure.

FIG. 19 is a schematic diagram of a driving mode of a display substrate according to an embodiment of the present disclosure. As shown in FIG. 19, the display substrate can adopt passive matrix (PM) driving, and the display substrate further includes a first signal line 610 extending along the column direction and a second signal line 620 extending along the row direction. For example, as shown in FIG. 19, in the case where each light emitting unit includes two second electrodes connected with two second contact pads 220, the second signal lines 620 respectively electrically connected with the two second electrodes, are configured to input the same common signal, and the second signal lines 620 can be connected with the second electrodes, which serve as a common electrode, of the light emitting unit through via holes. For example, each first signal line 610 is connected with the first electrodes of one column of light emitting sub-units in the light emitting unit, respectively, so as to control the light emitting region of each light emitting sub-unit to emit light.

Figure 20:
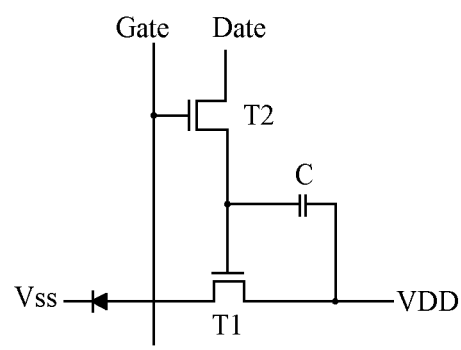
FIG. 20 and FIG. 21 are schematic diagrams of driving modes of a display substrate according to another embodiment of the present disclosure.
Figure 21:
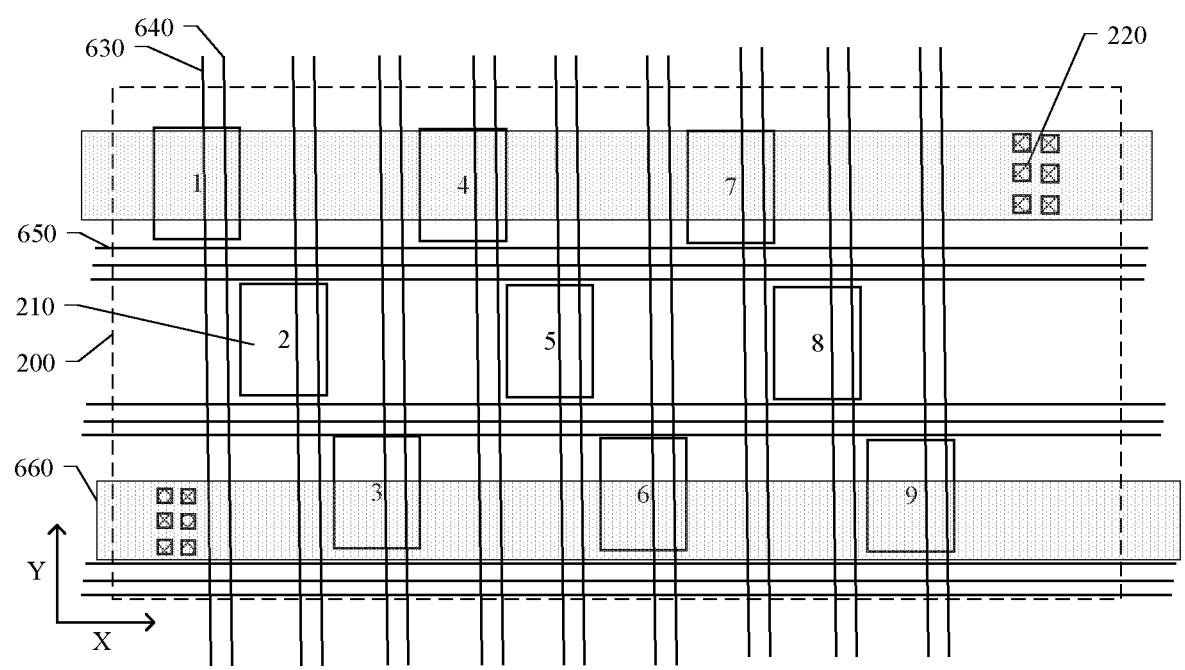

FIG. 20 and FIG. 21 are schematic diagrams of driving modes of a display substrate according to another embodiment of the present disclosure, and FIG. 20 is a schematic diagram of a driving circuit of each light emitting sub-unit. As shown in FIG. 20, the driving circuit of each light emitting sub-unit can have a 2T1C structure, and the driving circuit can include a light emitting control transistor T1, a driving transistor T2, and a storage capacitor C. The present embodiment includes but is not limited thereto. For example, the driving circuit 210 can also have a structure of, for example, 5T1C, 6T1C, 7T1C or 8T2C, etc.

As shown in FIG. 20 and FIG. 21, the display substrate further includes a gate line 630, a data line 640, a first power signal line 650, and a second power signal line 660. For example, the gate line 630 and the data line 640 can both extend along the column direction, and the first power signal line 650 and the second power signal line 660 can both extend along the row direction. The embodiment of the present disclosure is not limited thereto, and one of the gate line 630 and the data line 640 can also extend along the row direction, and the specific arrangement can be designed according to the space of the actual product, which is not limited in the embodiment of the present disclosure.

Each light emitting sub-unit in the light emitting unit is connected with one corresponding gate line 630, and the gate line 630 provides a gate driving signal Gate for the light emitting sub-unit; each light emitting sub-unit in the light emitting unit is connected with one corresponding data line 640, and the data line 640 provides a data signal Date for the light emitting sub-unit; each light emitting sub-unit in the light emitting unit is connected with one corresponding first power signal line 650, and the first power signal line 650 provides a first voltage signal VDD for the light emitting sub-unit; the light emitting sub-units in the light emitting unit are connected with the same second power signal line 660, and the second power signal line 660 provides a second voltage signal VSS for each light emitting sub-unit. It should be noted that, for the sake of clarity, FIG. 21 only illustratively shows one pixel region, a light emitting unit corresponding to the pixel region, and a gate line, a data line, a first power signal line and a second power signal line which are connected with the light emitting unit.

For example, in the case where the light emitting unit includes N light emitting sub-units, N first power signal lines 650 need to be provided.

For example, one of the first voltage signal VDD and the second voltage signal VSS is a signal output from a high voltage terminal, and the other of the first voltage signal VDD and the second voltage signal VSS is a signal output from a low voltage terminal. For example, in the embodiment shown in FIG. 21, the first voltage signal VDD can be a positive voltage and the second voltage signal VSS can be a negative voltage.

Another embodiment of the present disclosure provides a display device, which includes the display substrate provided by any of the above embodiments. In the embodiments of the present disclosure, by setting the positional relationship of the light emitting regions of two adjacent columns of light emitting sub-units in the display device, there may be no black region between the light emitting regions of two adjacent columns of light emitting sub-units, so as to improve the display effect.

For example, the display device can be a 3D display device.

The following statements should be noted:

(1) The accompanying drawings related to the embodiment(s) of the present disclosure involve only the structure(s) in connection with the embodiment(s) of the present disclosure, and other structure(s) can be referred to common design(s).

(2) In case of no conflict, features in one embodiment or in different embodiments of the present disclosure can be combined.

What have been described above are only specific implementations of the present disclosure, and the protection scope of the present disclosure is not limited thereto. Therefore, the protection scope of the present disclosure should be determined based on the protection scope of the appended claims.

What is claimed is:

1. A display substrate, comprising:
a backplane, comprising a plurality of pixel regions;
a plurality of light emitting units, arranged in one-to-one correspondence with the plurality of pixel regions,
wherein each of the plurality of light emitting units comprises light emitting sub-units arranged in a plurality of rows and a plurality of columns, each row of light emitting sub-units comprises a plurality of light emitting sub-units arranged along a row direction, each column of light emitting sub-units comprises one light emitting sub-unit, and orthographic projections of light emitting regions of two adjacent columns of light emitting sub-units on a first straight line extending along a column direction are not overlapped; and
each of the plurality of pixel regions comprises first contact pads arranged in a plurality of rows and a plurality of columns and at least one second contact pad, and the at least one second contact pad is located at one side of the first contact pad away from a center of the each of the plurality of pixel regions, and distributed at an edge of the each of the plurality of pixel regions;
each of the plurality of light emitting units comprises a plurality of first electrodes and at least one second electrode located at a same side, and each of the light emitting sub-units comprises one first electrode, at least parts of the plurality of first electrodes are configured to be respectively connected with the first contact pads arranged in the plurality of rows and the plurality of columns, and the second electrode is configured to be connected with the second contact pad;
in each of the plurality of light emitting units, the second electrode is a common electrode shared by at least two light emitting sub-units.

2. The display substrate according to claim 1, wherein the orthographic projections of the light emitting regions of the two adjacent columns of light emitting sub-units on the second straight line are overlapped, or, endpoints, which are close to each other, of the orthographic projections of the light emitting regions of the two adjacent columns of light emitting sub-units on the second straight line coincide.

3. The display substrate according to claim 1, wherein a distance between light emitting regions of any two light emitting sub-units located in a same row and adjacent to each other is equal.

4. The display substrate according to claim 1, wherein the light emitting sub-units arranged in the plurality of rows and the plurality of columns comprise N rows of light emitting sub-units, and an orthographic projection of light emitting regions of an n-th row of light emitting sub-units on the second straight line is located between an orthographic projection of light emitting regions of an (n−1)-th row of light emitting sub-units on the second straight line and an orthographic projection of light emitting regions of an (n+1)-th row of light emitting sub-units on the second straight line, or the orthographic projection of the light emitting regions of the n-th row of light emitting sub-units on the second straight line is located between the orthographic projection of the light emitting regions of the (n−1)-th row of light emitting sub-units on the second straight line and an orthographic projection of light emitting regions of a first row of light emitting sub-units on the second straight line, where N>1 and 1<n≤N.

5. The display substrate according to claim 1, wherein each of the plurality of light emitting units further comprises a plurality of first conductive type semiconductor layers, a second conductive type semiconductor layer and a light emitting layer located between the plurality of first conductive type semiconductor layers and the second conductive type semiconductor layer, the plurality of first conductive type semiconductor layers are respectively connected with the plurality of first electrodes in one-to-one correspondence, and the second conductive type semiconductor layer is connected with the second electrode.

6. The display substrate according to claim 5, wherein, in each of the plurality of light emitting units, the second electrode is a common electrode shared by the plurality of light emitting sub-units, and the second conductive type semiconductor layer is a continuous film.

7. The display substrate according to claim 6, wherein, in each of the plurality of light emitting units, each of the plurality of light emitting sub-units comprises a plurality of nano-pillar structures arranged at intervals, each of the plurality of nano-pillar structures at least comprises the light emitting layer, the first conductive type semiconductor layer and the first electrode which are stacked, and the light emitting region of each of the plurality of light emitting sub-units is at least partially overlapped with each of the plurality of first contact pads.

8. The display substrate according to claim 7, wherein each row of first contact pads comprises a plurality of first contact pads arranged along the row direction, each column of first contact pads comprises one first contact pad, and orthographic projections of two adjacent columns of first contact pads on the first straight line are not overlapped; and in each of the plurality of pixel regions, there is no gap between orthographic projections of the two adjacent columns of first contact pads on the second straight line.

9. The display substrate according to claim 8, wherein the orthographic projections of the two adjacent columns of first contact pads on the second straight line are overlapped, or, endpoints, which are close to each other, of the orthographic projections of the two adjacent columns of first contact pads on the second straight line coincide.

10. The display substrate according to claim 8, wherein a distance between any two first contact pads located in a same row and adjacent to each other is equal.

11. The display substrate according to claim 8, wherein a pitch of the plurality of nano-pillar structures along the row direction is less than a distance between adjacent first contact pads arranged along the row direction.

12. The display substrate according to claim 11, wherein the magnitude of the pitch along the row direction is in a range from 200 nanometers to 100 micrometers, the distance between adjacent first contact pads arranged along the row direction is in a range from 5 micrometers to 1000 micrometers, and the size of each of the plurality of nano-pillar structures along the row direction is in a range from 100 nanometers to 50 micrometers.

13. The display substrate according to claim 6, wherein, in each of the plurality of light emitting units, the light emitting layer is a continuous film.

14. The display substrate according to claim 13, wherein the backplane is located at a light exiting side of the plurality of light emitting units, and a light shielding layer is disposed at least one of between adjacent light emitting units, at a side of the plurality of light emitting units away from the backplane and between adjacent first electrodes.

15. The display substrate according to claim 1, further comprising:
a light splitting device, located at a light exiting side of the plurality of light emitting units, and configured to split light emitted from the plurality of light emitting sub-units into different viewpoint regions.

16. The display substrate according to claim 15, wherein the backplane comprises a base substrate, the light splitting device comprises a plurality of lenses arranged along the row direction, and an orthographic projection of each of the plurality of lens on the base substrate is overlapped with an orthographic projection of one column of light emitting units on the base substrate.

17. The display substrate according to claim 1, wherein each of the plurality of light emitting units is a micro light emitting diode or a mini light emitting diode.

18. A display device, comprising the display substrate according to claim 1.

19. A display substrate, comprising:
a backplane, comprising a plurality of pixel regions;
a plurality of light emitting units, arranged in one-to-one correspondence with the plurality of pixel regions,
wherein each of the plurality of light emitting units comprises light emitting sub-units arranged in a plurality of rows and a plurality of columns, each row of light emitting sub-units comprises a plurality of light emitting sub-units arranged along a row direction, each column of light emitting sub-units comprises one light emitting sub-unit; and in each of the plurality of light emitting units, there is no gap between orthographic projections of the light emitting regions of the two adjacent columns of light emitting sub-units on a straight line extending along the row direction;

each of the plurality of pixel regions comprises first contact pads arranged in a plurality of rows and a plurality of columns and at least one second contact pad, and the at least one second contact pad is located at one side of the first contact pad away from a center of the each of the plurality of pixel regions, and distributed at an edge of the each of the plurality of pixel regions;

each of the plurality of light emitting units comprises a plurality of first electrodes and at least one second electrode located at a same side, and each of the light emitting sub-units comprises one first electrode, at least parts of the plurality of first electrodes are configured to be respectively connected with the first contact pads arranged in the plurality of rows and the plurality of columns, and the second electrode is configured to be connected with the second contact pad;

in each of the plurality of light emitting units, the second electrode is a common electrode shared by at least two light emitting sub-units.

20. A display substrate, comprising:
a backplane, comprising a plurality of pixel regions;
a plurality of light emitting units, arranged in one-to-one correspondence with the plurality of pixel regions,
wherein each of the plurality of light emitting units comprises light emitting sub-units arranged in a plurality of rows and a plurality of columns, each row of light emitting sub-units comprises a plurality of light emitting sub-units arranged along a row direction, each column of light emitting sub-units comprises one light emitting sub-unit, and orthographic projections of light emitting regions of two adjacent columns of light emitting sub-units on a first straight line extending along a column direction are not overlapped; and in each of the plurality of light emitting units, there is no gap between orthographic projections of the light emitting regions of the two adjacent columns of light emitting sub-units on a second straight line extending along the row direction;

each of the plurality of pixel regions comprises first contact pads arranged in a plurality of rows and a plurality of columns and at least one second contact pad, and the at least one second contact pad is located at one side of the first contact pad away from a center of the each of the plurality of pixel regions, and distributed at an edge of the each of the plurality of pixel regions;

each of the plurality of light emitting units comprises a plurality of first electrodes and at least one second electrode located at a same side, and each of the light emitting sub-units comprises one first electrode, at least parts of the plurality of first electrodes are configured to be respectively connected with the first contact pads arranged in the plurality of rows and the plurality of columns, and the second electrode is configured to be connected with the second contact pad;

each of the plurality of light emitting units further comprises a plurality of first conductive type semiconductor layers, a second conductive type semiconductor layer and a light emitting layer located between the plurality of first conductive type semiconductor layers and the second conductive type semiconductor layer, the plurality of first conductive type semiconductor layers are respectively connected with the plurality of first electrodes in one-to-one correspondence, and the second conductive type semiconductor layer is connected with the second electrode.

\* \* \* \* \*